(12) United States Patent
Hasegawa et al.

(10) Patent No.: US 6,556,094 B2
(45) Date of Patent: Apr. 29, 2003

(54) OSCILLATOR CIRCUIT AND INTEGRATED CIRCUIT FOR OSCILLATION

(75) Inventors: Eiichi Hasegawa, Chiba (JP); Masahisa Kimura, Tokyo (JP); Kazuhisa Oyama, Tokyo (JP); Kunihiko Tsukagoshi, Chiba (JP)

(73) Assignee: Nippon Precision Circuits Inc., Tokyo (JP)

( * ) Notice: Subject to any disclaimer, the term of this patent is extended or adjusted under 35 U.S.C. 154(b) by 13 days.

(21) Appl. No.: 10/015,823

(22) Filed: Oct. 26, 2001

(65) Prior Publication Data

US 2002/0125965 A1 Sep. 12, 2002

(30) Foreign Application Priority Data

Oct. 27, 2000 (JP) .......................... 2000-329012
May 28, 2001 (JP) .......................... 2001-158865

(51) Int. Cl.[7] .................. H03B 5/32; H03B 5/24; H03B 5/36
(52) U.S. Cl. ................ 331/158; 331/116 FE; 331/75; 331/173; 331/57
(58) Field of Search .............. 331/57, 74, 75, 331/116 R, 116 FE, 116 M, 154, 158, 173, 177 R, 177 V

(56) References Cited

U.S. PATENT DOCUMENTS 5,757,242 A * 5/1998 Chow et al. .................. 331/57

FOREIGN PATENT DOCUMENTS

| JP | 58229289 | 12/1983 |
| JP | 09313020 | 11/1997 |
| JP | 09005765 | 1/1998 |

* cited by examiner

*Primary Examiner*—David C. Mis
(74) *Attorney, Agent, or Firm*—Joel E. Lutzker; Anna Vishev; Schulte Roth & Zabel LLP

(57) ABSTRACT

An oscillator circuit adapted for a piezoelectric oscillator which has a weak oscillation output for generating high frequencies is provided. The speed of operation of the oscillator circuit is increased. An integrated circuit for such an oscillator circuit is also provided. The oscillator circuit has an amplifier portion consisting of CMOS inverters connected in cascade. MOS transistors forming the CMOS inverters have channel widths that decrease successively from the first stage to the last stage to improve the amplification factor of the amplifier portion at high frequencies. This makes it possible to amplify weak oscillation output from the quartz oscillator (XL). A filter circuit produces a peak of negative resistance at a frequency higher than conventional. This permit oscillation operation at higher frequencies.

33 Claims, 15 Drawing Sheets

PRIOR ART

PRIOR ART

OSCILLATOR CIRCUIT AND INTEGRATED CIRCUIT FOR OSCILLATION

BACKGROUND OF THE INVENTION

1. Field of the Invention

The present invention relates to an oscillator circuit having an amplifier circuit for amplifying the oscillation output from a piezoelectric oscillator such as a quartz oscillator and to an integrated circuit for oscillation. More particularly, the invention relates to an oscillator circuit adapted for high-frequency operation and to an integrated circuit for oscillation.

2. Description of the Related Art

Conventionally, an oscillator circuit equipped with an amplifier circuit for amplifying the oscillation output from a piezoelectric oscillator such as a quartz oscillator as shown in FIG. 17 is available. In this circuit, a quartz oscillator XL is connected between the input terminal in and the output terminal out of the CMOS inverter INV acting as an amplifier portion. Also, a feedback resistor Rf is connected between these input and output terminals. The input terminal in and output terminal out are connected with a power-supply terminal VSS (0 V) via capacitive elements CG and CD, respectively, serving as load capacitors.

Today, oscillator circuits are required to operate at higher frequencies. As the operating frequency is made higher, the size of the quartz oscillator decreases. Concomitantly, the oscillation output, i.e., the electric current (hereinafter may be referred to as "quartz current") flowing through the quartz oscillator, becomes weaker. Therefore, in the configuration of FIG. 17, oscillation is possible for a quartz oscillator up to where a 100 MHz third overtone is used as the oscillation frequency. However, at still higher frequencies exceeding 120 MHz, for example, the amplification factor of the amplifier portion is small and so the oscillation output cannot be amplified sufficiently. Consequently, it has been impossible to operate the circuit as an oscillator circuit.

Where one attempts to produce higher frequencies by making use of overtones higher than the third overtone, the following problems take place. The configuration of FIG. 17 is integrated except for the quartz oscillator XL. As shown in the equivalent circuit of FIG. 18, the quartz oscillator XL can be represented as a series circuit of a resistor RX and an inductor LX. The other components in the form of an integrated circuit can be represented as a series circuit of a negative resistor RL and a capacitor CL. The frequency characteristics of the negative resistor RL are shown in FIG. 19, where the resistance value is plotted on the vertical axis and the frequency on the horizontal axis. Thus, the negative resistance RL of the third overtone oscillation is indicated. The values of resistive components of the quartz oscillator at the fundamental wave, third overtone, and fifth overtone are indicated by R01, R03, and R05, respectively. If the negative resistance RL is greater than that of the resistance RX in the negative direction, the circuit operates as an oscillator circuit. If a quartz oscillator of 30 MHz is used to generate the third overtone in the configuration of FIG. 17, the negative resistance RL decreases with frequency from a peak close to 30 MHz that is the oscillation frequency of the third overtone as shown in FIG. 19. For example, at the oscillation frequency of 50 MHz of the fifth overtone, the negative resistance RL is smaller than the resistive component of RX of the quartz oscillator and, therefore, the oscillator circuit cannot be set into operation. For this reason, a coil LADD and a capacitive element CADD are sometimes connected between a capacitive element CD and a power-supply terminal VSS as shown in FIG. 20 to produce the fifth overtone. However, it is necessary to provide the external coil LADD and capacitive element CADD, which in turn increases the circuit area. In addition, it is laborious to control the values of these added elements.

SUMMARY OF THE INVENTION

Accordingly, it is an object of the present invention to provide an oscillator circuit which is adapted for a piezoelectric oscillator which generates a weak oscillation output. The provided oscillator circuit operates at increased speed. It is another object of the invention to provide an integrated circuit which is used for oscillation and which is used to construct the above oscillator circuit.

An oscillator circuit in accordance with the present invention comprises: an amplifier portion consisting of plural CMOS inverters connected in cascade; a piezoelectric oscillator connected between the input and the output terminals of the amplifier portion; a first load capacitor connected between the input terminal of the amplifier portion and a terminal at a certain potential; a second load capacitor connected between the output terminal of the amplifier portion and the terminal at the certain potential; and a filter circuit included in the amplifier portion. The CMOS inverters have gate areas which decrease successively in going from the first stage to the last stage.

Preferably, the filter circuit is defined such that the negative resistance of the circuit formed by the amplifier portion, the feedback resistor, the first and second load capacitors has a peak at a given frequency.

Preferably, the filter circuit described above is in a signal path between the input and the output terminals of the amplifier portion. A capacitive element is connected with the input terminal of at least one of the above-described plural CMOS inverters. A resistor is connected between the input terminal of the CMOS inverter with which the capacitive element is connected and the output terminal.

The above-described filter circuit is preferably composed of a capacitive element and a resistor. In the preferred embodiment shown in FIG. 1, the capacitive element is connected between the input terminal of the amplifier portion and the input terminal of the first-stage CMOS inverter of the amplifier portion. The resistor is connected between the input and output terminals of the first-stage CMOS inverter.

In the above-described amplifier portion, the CMOS inverters desirably have the same channel length. The CMOS inverters have channel widths that decrease successively in going from the first stage to the last stage.

Another oscillator circuit in accordance with the present invention comprises: an amplifier portion consisting of first, second, and third CMOS inverters connected in cascade, said CMOS inverters having gate areas that decrease successively in going from the first stage to the last stage; a filter circuit consisting of a capacitive element and a resistor connected between the input and the output terminals of the first CMOS inverter, the capacitive element having one terminal connected with the input terminal of the first CMOS inverter and the other terminal acting as the input terminal of the amplifier portion; a piezoelectric oscillator connected between the input and output terminals of the amplifier portion; a feedback resistor connected between the input terminal of the amplifier portion and a terminal at a certain potential; and a second load capacitor connected between the output terminal of the amplifier portion and the terminal at the certain potential.

Preferably, each of the above-described oscillator circuits has a resistor connected to at least one of first and second signal paths to suppress the electric current flowing through the piezoelectric oscillator. The first signal path is formed by the input terminal of the amplifier with which the first load capacitor is connected and by the certain potential. The second signal path is formed by the output terminal of the amplifier with which the second load capacitor is connected and by the certain potential.

In each of the above-described oscillator circuits, the sources of the MOS transistors forming the CMOS inverters of the amplifier portion and the terminal at the certain potential are preferably connected with a power-supply potential via a current-limiting device. Desirably, the current-limiting device connects some of the plural MOS transistors in parallel. The others of the plural MOS transistors are all turned on under an initial condition of the oscillation output delivered from the output terminal described above. As the oscillation output becomes more stabilized, the MOS transistors are turned off successively.

Preferably, the aforementioned piezoelectric oscillator of the oscillator circuit is a quartz oscillator and effects overtone oscillation.

Preferably, in each of the oscillator circuits, an output terminal for producing an output signal to the later-stage circuit is connected with the output terminal of the CMOS inverter in a stage immediately preceding the last stage of the amplifier portion.

Preferably, in each of the oscillator circuits, one input terminal of a differential amplifier circuit is connected with the input terminal of the CMOS inverter in a stage immediately preceding the last stage of the amplifier portion. The other input terminal of the differential amplifier circuit is connected with the output terminal of this CMOS inverter. An output signal for a later-stage circuit is delivered from the output terminal of the differential amplifier circuit.

Preferably, the components of the oscillator circuit excluding the piezoelectric oscillator are built as an integrated circuit for oscillation. More preferably, the capacitive elements are intermetallic capacitors, and the resistors are thin-film resistors.

The above and other objects, aspects, features and advantages of the invention will be more readily apparent from the description of the preferred embodiments thereof taken in conjunction with the accompanying drawings and appended claims.

BRIEF DESCRIPTION OF THE DRAWINGS

The invention is illustrated by way of the example described below and the figures of the accompanying drawings in which like references denote like or corresponding parts, which in no way should be considered as a limitation of the invention.

DESCRIPTION OF THE PREFERRED EMBODIMENTS

Figure 1:
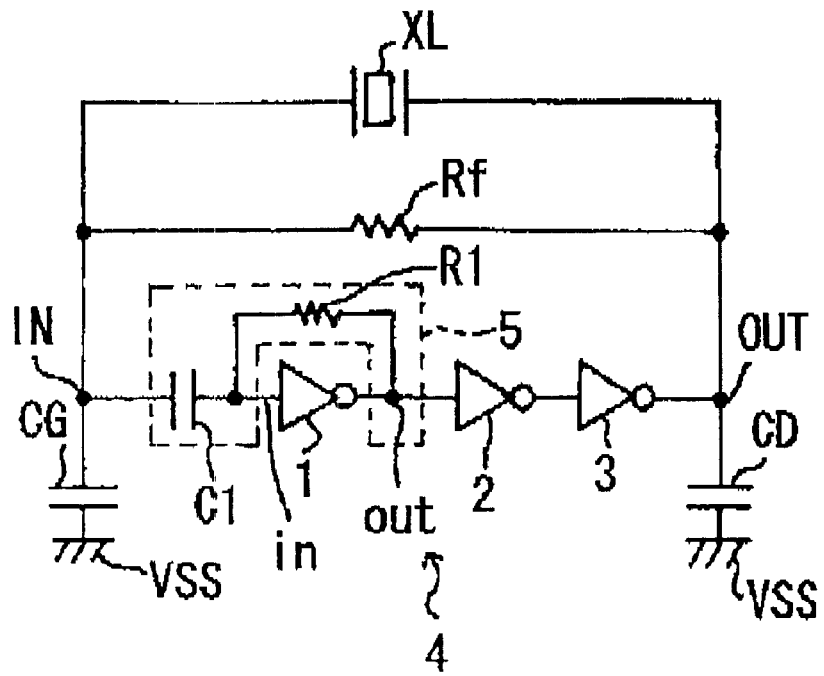
FIG. 1 is a circuit diagram illustrating the configuration of an oscillator circuit in accordance with a first embodiment of the present invention.

An oscillator circuit and an integrated circuit for oscillation, both built in accordance with the present invention, are described below in connection with a first embodiment of the invention illustrated in FIG. 1. In this figure, a quartz oscillator XL attached to the outside of the integrated circuit for oscillation produces threefold overtone in the present embodiment, the quartz oscillator acting as a piezoelectric oscillator. It is to be noted that the first embodiment, shown in FIG. 1, is not limited to the piezoelectric oscillator. It can also be utilized with a surface-acoustic-wave (SAW) oscillator or the like. Similar considerations can be given to other embodiments described below.

CMOS inverters 1, 2, and 3 are connected in cascade in succession from the first stage to the last stage to constitute an amplifier portion 4. MOS transistors forming these CMOS inverters 1–3 preferably have a same channel length but have successively smaller channel widths. Thus, these MOS transistors forming the inverters have successively smaller gate areas. For example, the channel width ration of the CMOS inverters 1, 2, and 3 is 4:2:1. This improves the amplification factor at high frequencies.

A feedback resistor Rf is connected between the input terminal IN and the output terminal OUT of the amplifier portion 4. The resistance value of this resistor is so set that the oscillator circuit in accordance with the present embodiment produces overtone oscillation. Capacitive elements CG and CD acting as load capacitors are connected between the input terminal VSS (0 V) and between the output terminal OUT and the power-supply terminal VSS, respectively.

A resistor R1 is connected between the input terminal in and the output terminal out of the CMOS inverter 1. A capacitive element C1 is connected between the input terminal in of the CMOS inverter 1 and the input terminal IN of the amplifier portion 4. The resistor R1 and the capacitive element C1 together form a filter circuit 5. The resistor R1 determines the operating point of the CMOS inverter 1.

The oscillator circuit in accordance with the present embodiment is composed of the components described thus far. These components, with the exception of the quartz oscillator XL, are preferably integrated as an integrated circuit for oscillation in accordance with the present embodiment.

The operation of the present embodiment is next described. The amplifier portion 4 has multiple stages of CMOS inverters. The CMOS inverters 1, 2, and 3 forming the amplifier portion have successively smaller gate areas but are identical in channel length. This way, the CMOS inverters have successively smaller channel width ratios. Consequently, the amplification factor of the amplifier portion is improved at high frequencies. Amplification is described in detail in Japanese patent publication No. 52885/1990 (Japanese patent application No. 229289/1983), entitled "C-MOS Amplifier."

Increase of the amplification factor at high frequencies is accomplished as follows.

The amplification factor of a CMOS inverter is substantially constant at low frequencies independent of frequency and can be approximated by $$A \cong \frac{g_{mP} + g_{mN}}{\frac{1}{r_{dsP}} + \frac{1}{r_{dsN}}} \tag{1}$$

where A is the amplification factor of the CMOS inverter, $g_{mP}$ is the mutual conductance of the P-channel MOS transistor, $g_{mN}$ is the mutual conductance of the N-channel MOS transistor, $r_{dsP}$ is the drain resistance of the P-channel MOS transistor in the saturated region, and $r_{dsN}$ is the drain resistance of the N-channel MOS transistor in the saturated region.

The amplification factor of a CMOS inverter at high frequencies is roughly in inverse proportion to frequency and can be approximated by $$A \cong \frac{g_{mP} + g_{mN}}{2\pi f(C_L + C_d)} \tag{2}$$

where f is frequency, $C_L$ is a the load capacitance of the CMOS inverter, and $C_D$ is the drain capacitance of the CMOS inverter itself.

Where the P-channel MOS transistor and the N-channel MOS transistor are equal in channel length, the mutual conductances $g_{mP}$, $g_{mN}$, and the drain capacitance $C_D$ are respectively given by $$g_{mP} = \mu_P \cdot C_{OX} \cdot \frac{W_P}{L} \cdot F_P(VDD, V_{TP}) \tag{3}$$
$$= K_1 \cdot \frac{W_P}{L}$$

$$g_{mN} = \mu_N \cdot C_{OX} \cdot \frac{W_N}{L} \cdot F_N(VDD, V_{TN}) \tag{4}$$
$$= K_2 \cdot \frac{W_N}{L}$$

$$C_d \cong K_3 \cdot C_{JP} \cdot W_P + K_4 \cdot C_{JN} \cdot W_N \tag{5}$$

where $\mu_P$ is the mobility of the P-channel MOS transistor, $\mu_N$ is the mobility of the N-channel MOS transistor, $W_P$ is the channel width of the P-channel MOS transistor, $W_N$ is the channel width of the N-channel MOS transistor, L is the channel length of the P- and N-channel MOS transistors, $F_P$ (VDD, $V_{TP}$) is a function of VDD and $V_{TP}$, $F_N$ (VDD, $V_{TN}$) is a function of VDD and $V_{TN}$, $V_{TP}$ is the threshold voltage of the P-channel MOS transistor, $V_{TN}$ is the threshold voltage of the N-channel MOS transistor VDD, $K_1$ to $K_4$ are constants independent of $W_P$ and $W_N$, $C_{JP}$ is a junction capacitance of the P-channel MOS transistor, and $C_{JN}$ is the junction capacitance of the N-channel MOS transistor. If the ratio of the channel width $W_P$ to the channel width $W_N$ is set to a constant value of r, the relation $$r = \frac{W_P}{W_N}$$

holds. Therefore we have $$\frac{C_d}{g_{mP} + g_{mN}} \cong L \cdot \frac{K_3 \cdot C_{JP} \cdot W_P + K_4 \cdot C_{JN} \cdot W_N}{K_1 W_P + K_2 W_N} \tag{6}$$
$$\cong L \cdot \frac{K_3 \cdot C_{JP} \cdot r + K_4 \cdot C_{JN}}{K_1 r + K_2} = K_5$$

where $K_5$ is a constant independent of $W_P$ and $W_N$. It can be seen from EQ. (6) that $$\frac{C_d}{g_{mP} + g_{mN}}$$

does not depend on $W_P$ and $W_N$ of the CMOS inverters.

$C_L$ is the load capacitor of the CMOS inverter and is substantially equal to the gate capacitance of the P- and N-channel MOS transistors in the next-stage CMOS inverter that is located in the center of the cascade arrangement. In practice, stray capacitance $C_L$ such as the capacitance of metal interconnects is also included but it is so small that it can be neglected compared with the magnitude of the gate capacitance. Therefore, $C_L$ can be approximated by $$C_L \cong K_6 \cdot C_{OX} \cdot L(W_P' + W_N') \cong K_7(W_P' + W_N') \tag{7}$$

where $W_P'$ is the channel width of the P-channel MOS transistor in the next stage, $W_N'$ is the channel width of the N-channel MOS transistor in the next stage, $K_6$ and $K_7$ are constants independent of $W_P'$ and $W_N'$.

With respect to the next-stage CMOS inverter, if the ratio of the channel width $W_P'$ to the channel width $W_N'$ is equal to a constant value of r, we have the following relations since $r = W_P'/W_N'$.

$$\frac{C_L}{g_{mP} + g_{mN}} \cong K_7 \cdot \frac{W_P' + W_N'}{K_1 W_P + K_2 W_N} \quad (8)$$

$$\cong \frac{K_7(r+1)}{K_1 \cdot r + K_2} \cdot \frac{W_N'}{W_N}$$

$$\cong \frac{K_8 \cdot W_N'}{W_N}$$

where $K_8$ is a constant independent of $W_N$, $W_N'$ and $W_P$ and $W_P'$. Therefore, the amplification factor A of the CMOS inverter at high frequencies is given by $$A \cong \frac{1}{2\pi\left[K_8\left(\frac{W_N'}{W_N}\right) + K_7\right]} \quad (9)$$

It can be seen from this equation that the value of A increases with reducing the value of $W_N'/W_N$. That is, the amplification factor is increased by making the channel width of the next-stage MOS transistor of the cascaded CMOS inventers smaller than that of the previous stage.

Figure 2:
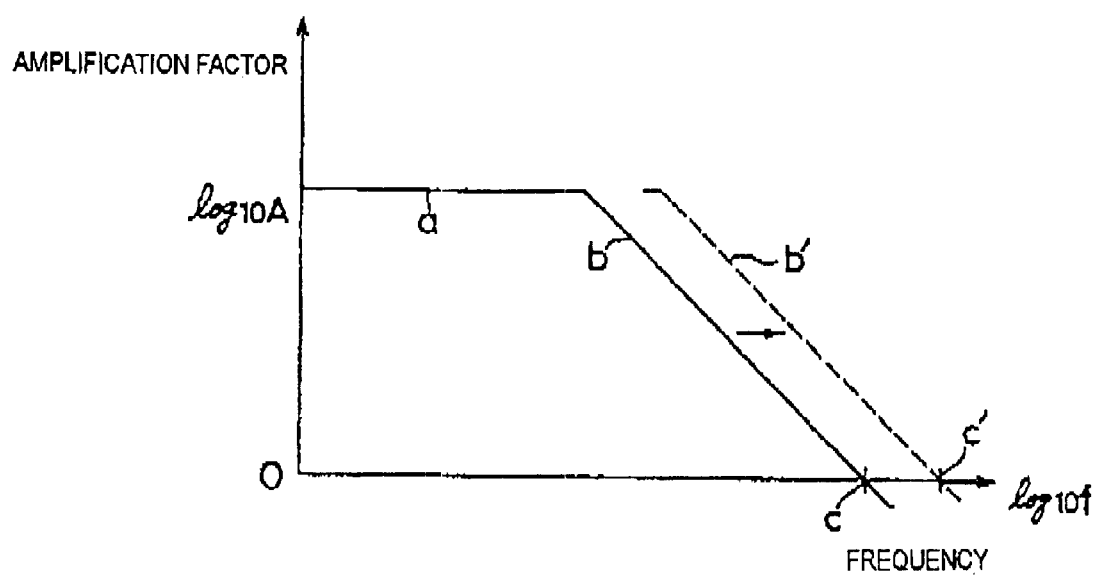
FIG. 2 is an amplification factor-frequency characteristic diagram illustrating the operation of the circuit shown in FIG. 1.

FIG. 2 illustrates the aforementioned results. Frequency f is plotted logarithmically on the horizontal axis and the amplification factor A is plotted logarithmically on the vertical axis. In FIG. 2, a bent line comprising portions a and b indicates the frequency dependence of the amplification factor per stage of the amplifier portion consisting of CMOS inverters connected in cascade and having the same dimensions. The amplification factor per stage obtained where the MOS transistors have channel widths that decrease toward the last stage is indicated by the broken line b' at high frequencies. The amplification factor increases for the same frequency. Furthermore, the frequency at which the logarithmic value of the amplification factor becomes null rises from c to c'. That is, the maximum operating frequency is elevated.

As described thus far, in the amplifier portion, CMOS inverters are connected in cascade, and the MOS transistors have channel widths that decrease in going from the first stage toward the last stage. The amplification factor of this amplifier portion is improved at high frequencies. However, if this amplifier portion is simply replaced by the prior art CMOS inverter INV, then it is difficult to start an oscillation operation. In particular, setting of the aforementioned negative resistance plays a key role in accomplishing oscillation. In the present embodiment, the negative resistance is optimized using the filter circuit 5. This is combined with the effect produced by improvement of the amplification factor of the amplifier portion to thereby permit oscillation operation at still higher frequencies. This is described below.

Figure 3A:
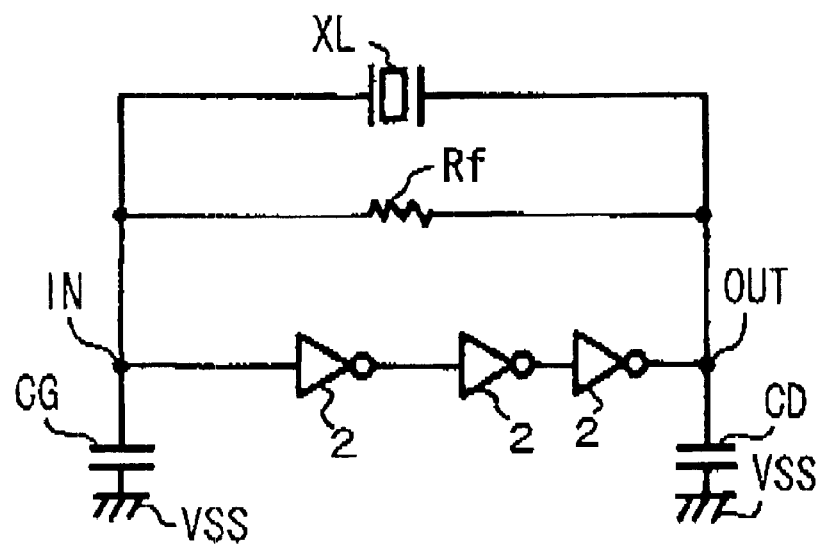
FIGS. 3A and 3B are circuit diagrams illustrating the configuration of an oscillator circuit similar to that shown in FIG. 1, and in which the filter circuit is omitted.
Figure 3B:
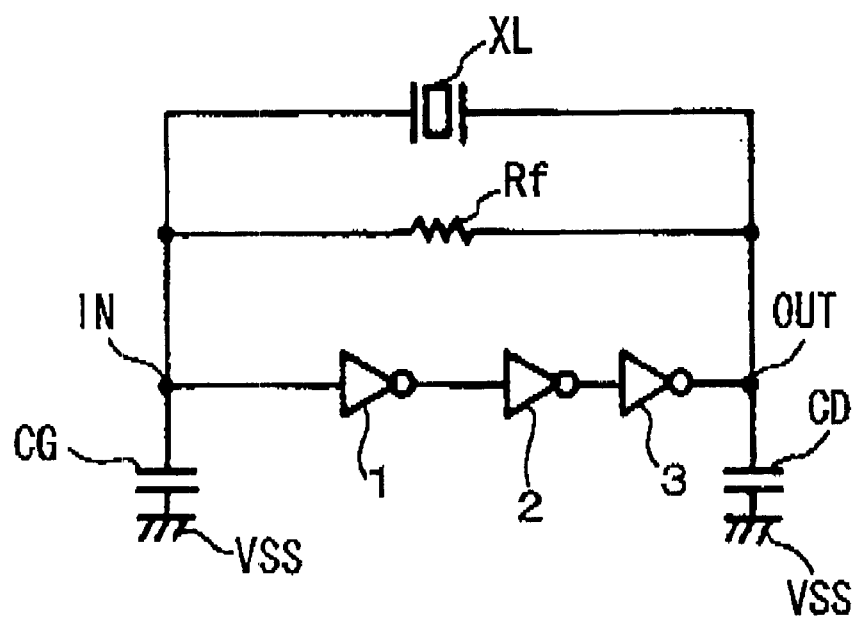
Figure 17:
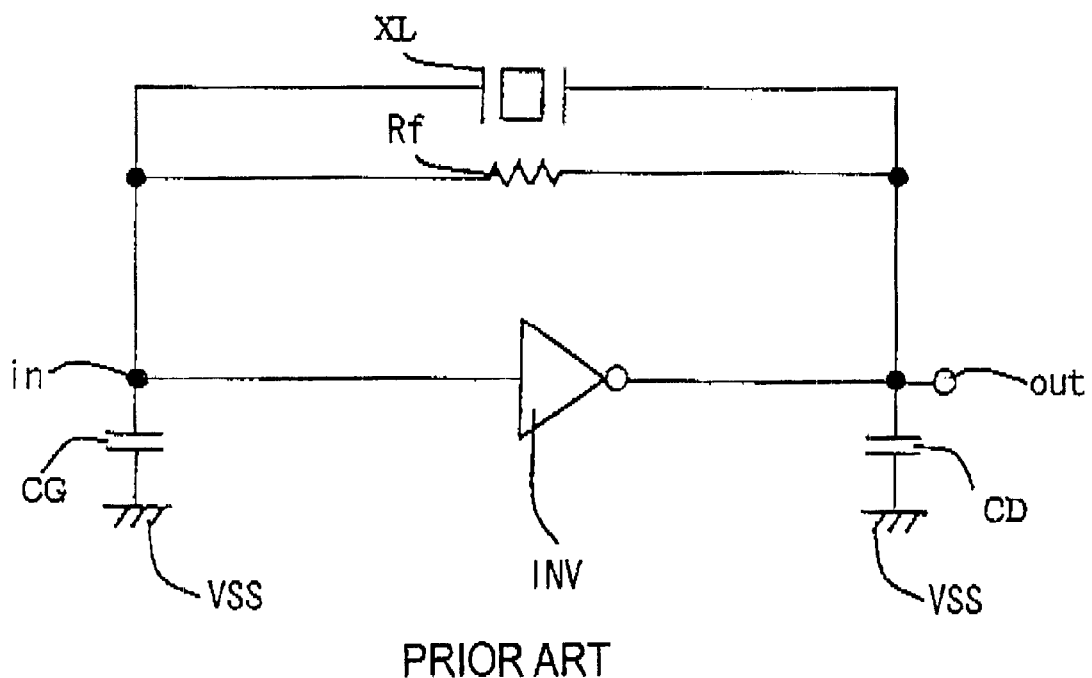
FIG. 17 is a circuit diagram illustrating the configuration of the prior art oscillator circuit.
Figure 18:
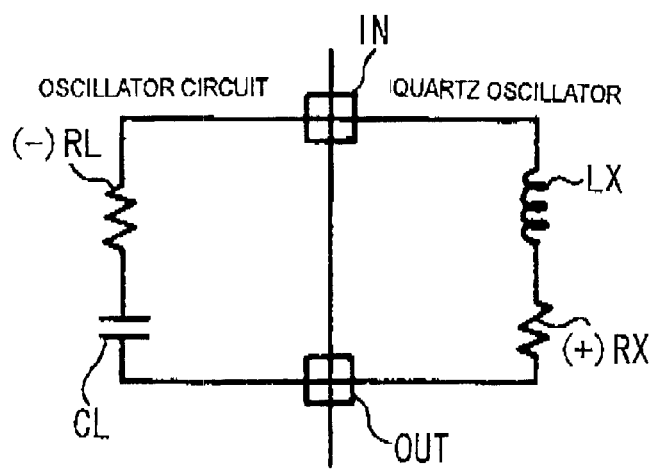
FIG. 18 is an equivalent circuit diagram of the circuit shown in FIG. 17.
Figure 19:
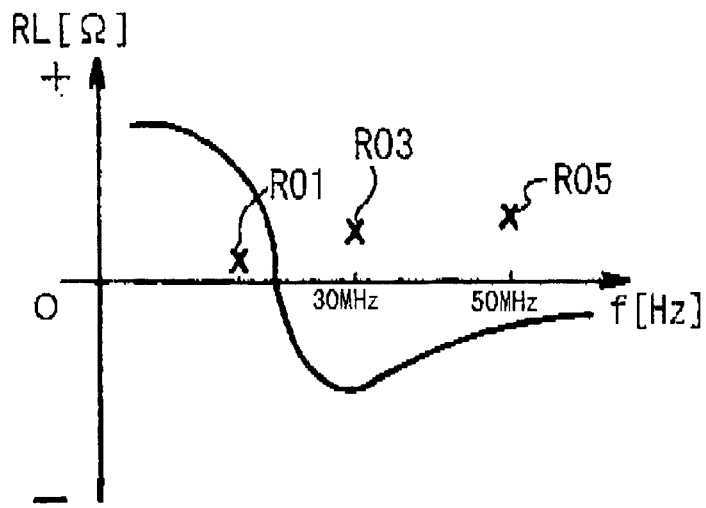
FIG. 19 is a negative resistance-frequency characteristic diagram illustrating the operation of the circuit shown in FIG. 17.
Figure 20:
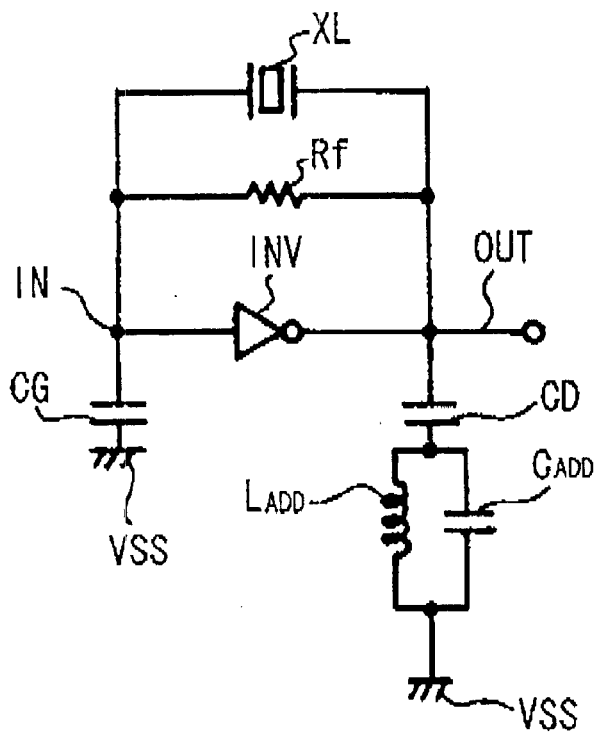
FIG. 20 is a circuit diagram illustrating the configuration of the prior art fifth overtone oscillator circuit.

The prior art oscillator circuit, that is also herein referred to as type I, uses only the CMOS inverter INV in its amplifier portion, as shown in FIG. 17. An oscillator circuit that is not equipped with the filter circuit 5 but has an amplifier portion fabricated simply by cascading three CMOS inverters 2 of equal gate area as shown in FIG. 3A is herein referred to as type II. An oscillator circuit that does not have the filter circuit 5 as shown in FIG. 3B is herein referred to as type III. The amplifier portion of this oscillator circuit has three CMOS inverters connected in cascade in the same way as in the embodiment shown in FIG. 1. The MOS transistors forming the CMOS inverters have the same channel length. The channel width radio is 4:2:1. That is, they have successively decreasing channel widths. The oscillator circuit in accordance with the embodiment shown in FIG. 1 is also referred to as type IV.

Figure 4:
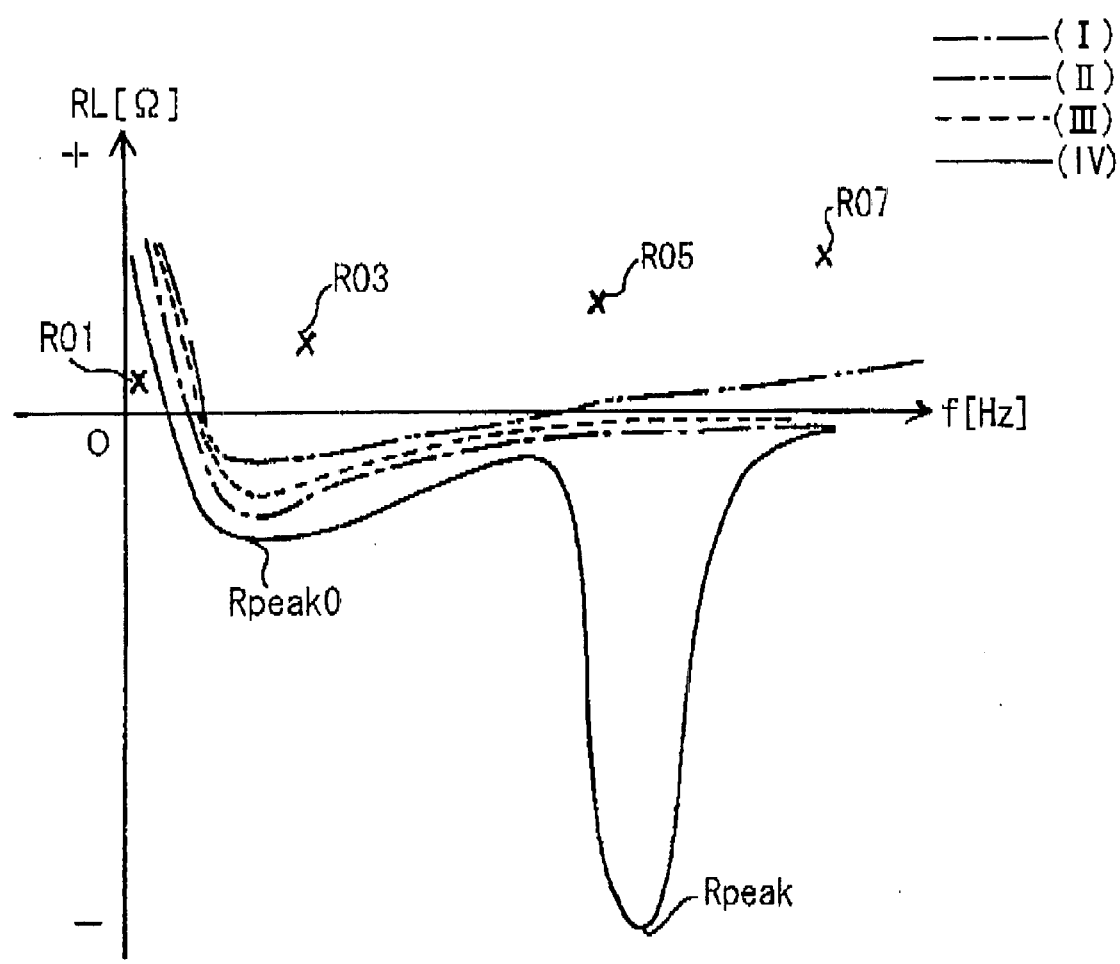
FIG. 4 is a negative resistance-frequency characteristic diagram illustrating the operation of the circuit shown in FIG. 1.
Figure 5:
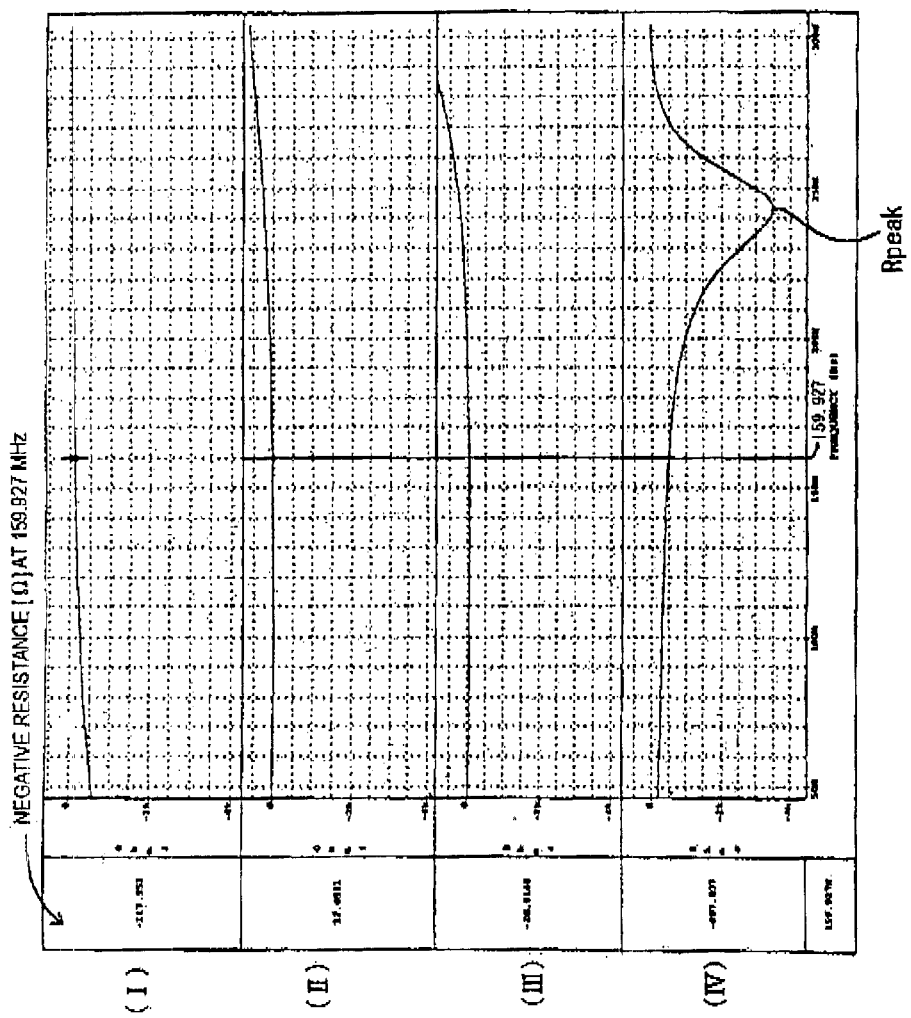
FIG. 5 is another negative resistance-frequency characteristic diagram illustrating the operation of the circuit shown in FIG. 1.

With respect to the above four types of oscillator circuits, the relation between the negative resistance and frequency is schematically indicated by characteristic curves (I)–(IV), respectively, of FIG. 4. In this figure, R01, R03, R05, and R07 indicate the values of the resistive components of the fundamental third overtone, fifth overtone and seventh overtone quartz oscillators, respectively. Simulations of these oscillator circuits of the types I–IV were conducted using specific parameters. As a result, the negative resistance at 50 MHz to 300 MHz are shown in lines (I)–(IV) of FIG. 5. With respect to the parameters, the power-supply voltage at the power-supply terminal VDD was set to 3V. The capacitance of the capacitive element CG was set to 10 pF. The capacitive element CD was set to 15 pF. The feedback resistor Rf was set to 200 KΩ. The capacitive component CX of the quartz oscillator was set to 1 pF. The channel lengths of the MOS transistors forming the CMOS inverters of these four types of oscillator circuits were set equal to each other. With respect to the ratio of the channel widths, the channel width of the MOS transistors forming the CMOS inverter of the type I was set to 4. The channel width of the MOS transistors forming the CMOS inverters of the type II was set to 2. The channel width of the MOS transistors forming the CMOS inverters of the types III and IV were set to 4, 2 and 1, respectively, from the first stage. These numbers may be regarded as ratios of widths of MOS transistors forming a single CMOS inverter as that, for example, used in stage three of the invented oscillation circuit.

In type I, a large negative resistance is obtained against the resistor R03 of the quartz oscillator for the third overtone as indicated by (I) in FIG. 4. As mentioned previously, as the frequency of the third overtone is increased, the oscillation output of the quartz oscillator drops, resulting in insufficient amplification factor of the amplifier portion. Consequently, frequency increase cannot be accomplished. With respect to overtones of orders higher than the third overtone, sufficient negative resistances against the resistors R05 and R07 cannot be obtained.

In the type II, large negative resistance cannot be obtained against the resistive components of the fundamental, third overtone, fifth overtone, and seventh overtone quartz oscillators as indicated by (II) of the FIG. 4. In consequence, these oscillators cannot be set into oscillation.

In the type III, slight increase of the negative resistance is observed as indicated by (III) of FIG. 4, but negative resistance sufficient to perform an oscillation operation cannot be obtained for all of the fundamental wave, third overtone, fifth overtone, and seventh overtone.

On the other hand, in the type IV oscillator designed in accordance with the first preferred embodiment (i.e., the amplifier portion 4 is so constructed that the three CMOS inverters are connected in cascade and that the CMOS inverters have gate areas which become successively smaller in going from the first stage to the last stage and having the filter circuit 5 added), large resistances are obtained against the resistors R03 and R05 of the third overtone and fifth overtone quartz oscillators indicated by (IV) of FIG. 4. In addition, the amplifier portion 4 can have a high amplification factor even at high frequencies as described above, and can amplify weak oscillation output even at high frequencies and enable oscillation operation.

Figure 6:
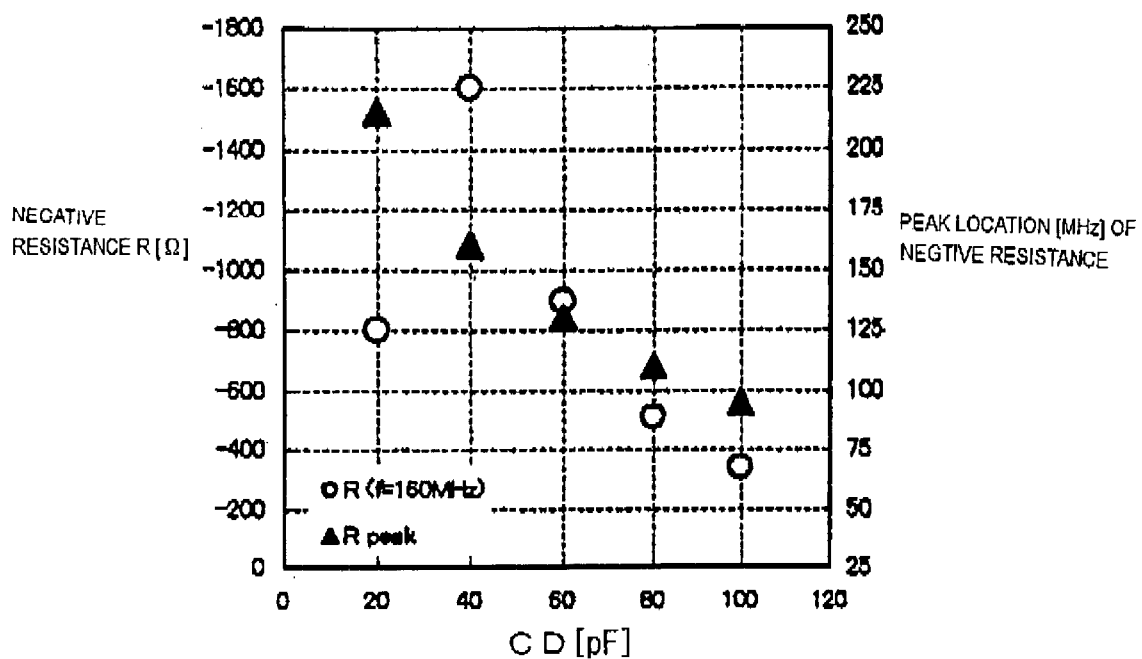
FIG. 6 is a negative resistance-load capacitance characteristic diagram illustrating the operation of the circuit shown in FIG. 1.
Figure 7:
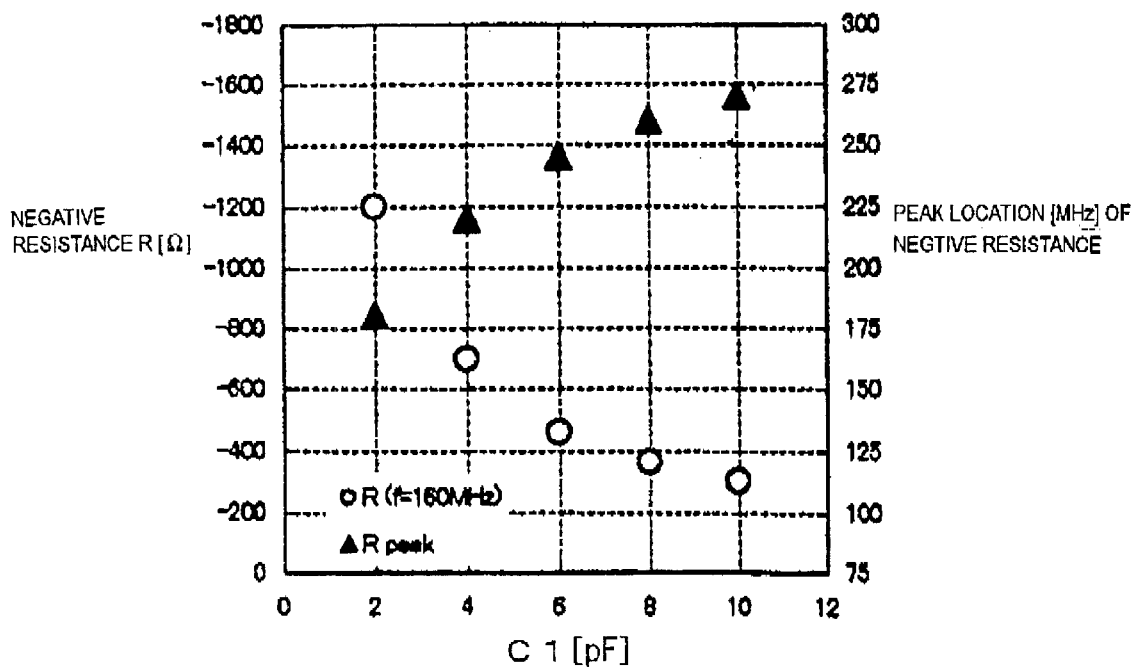
FIG. 7 is a diagram in which the characteristics of a capacitive element included in a filter circuit are plotted against negative resistance, illustrating the operation of the circuit shown in FIG. 1.

In the prior art third overtone oscillator circuit, the negative resistance has a peak ($R_{peak}0$ in FIG. 4) between the fundamental frequency and the third overtone frequency. In the first preferred embodiment, the provision of the filter circuit 5 produces an additional peak of the negative resistance ($R_{peak}$ in FIGS. 4 and 5) at a frequency higher than the third overtone frequency. This peak $R_{peak}$ of the negative resistance can be controlled by the capacitive element CD and the capacitive element C1 of the filter circuit 5 as shown in FIGS. 6 and 7. In FIGS. 6 and 7, frequency is plotted on the right vertical axis, and peaks $R_{peak}$ are indicated by triangles. The value of the negative resistance is plotted on the left vertical axis. The negative resistance at R at a frequency of 160 MHz is indicated by circles. In FIG. 6, the value of the capacitive element CD is plotted on the horizontal axis. In FIG. 7, the value of the capacitive element C1 of the filter circuit 5 is plotted on the horizontal axis. As can be seen from FIG. 6, as the value of the capacitive element CD is increased, the frequency of the peak $R_{peak}$ of the negative resistance drops. As can be seen from FIG. 7, the frequency of the peak $R_{peak}$ of the negative resistance is increased with increasing the value of the capacitive element C1 of the filter circuit 5.

Accordingly, the peak $R_{peak}$ of the negative resistance can be controlled by adjusting any one of the capacitive element CD and the capacitive element C1 of the filter circuit or by adjusting these in combination. A desired negative resistance can be accomplished at still higher frequencies. As a result, oscillation of fifth or higher-ordered overtones is enabled.

Figure 8:
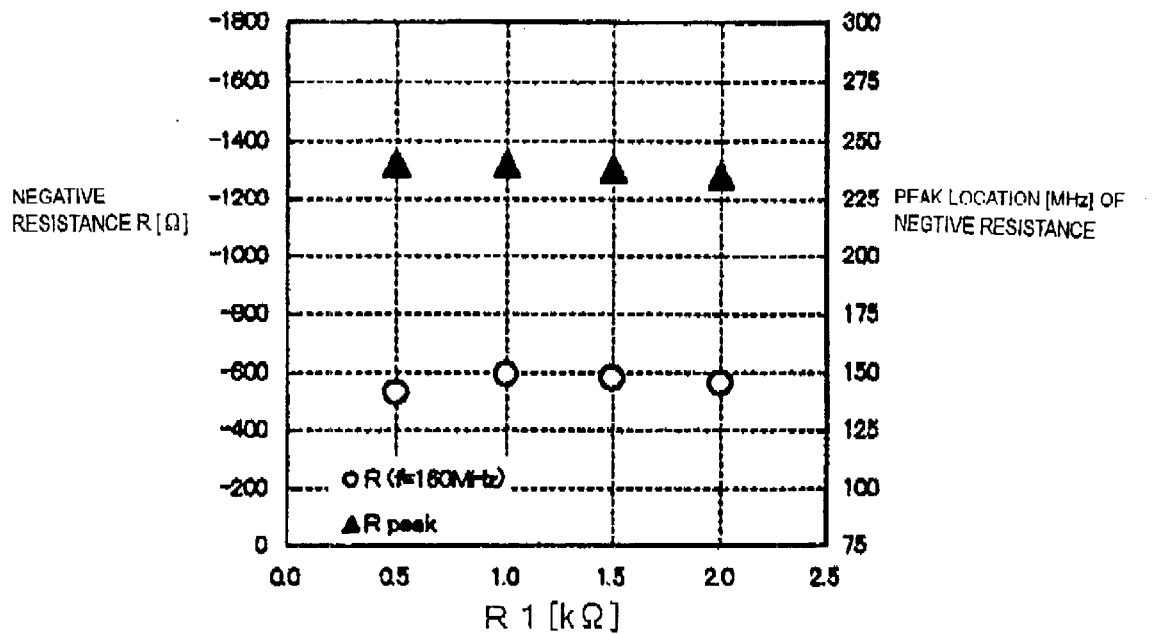
FIG. 8 is a characteristic diagram in which the resistance of a resistor included in the filter circuit is plotted against negative resistance, illustrating the operation of the circuit shown in FIG. 1.
Figure 9:
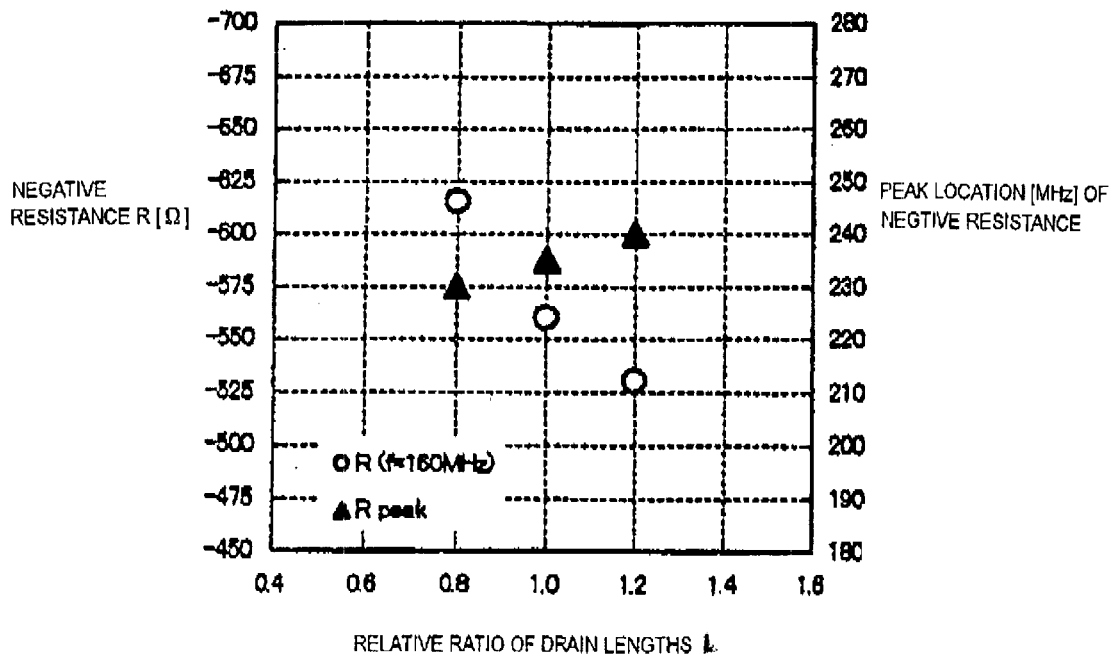
FIG. 9 is a characteristic diagram in which the drain lengths of MOS transistors forming CMOS inverters are plotted against negative resistance, illustrating the operation of the circuit shown in FIG. 1.
Figure 10:
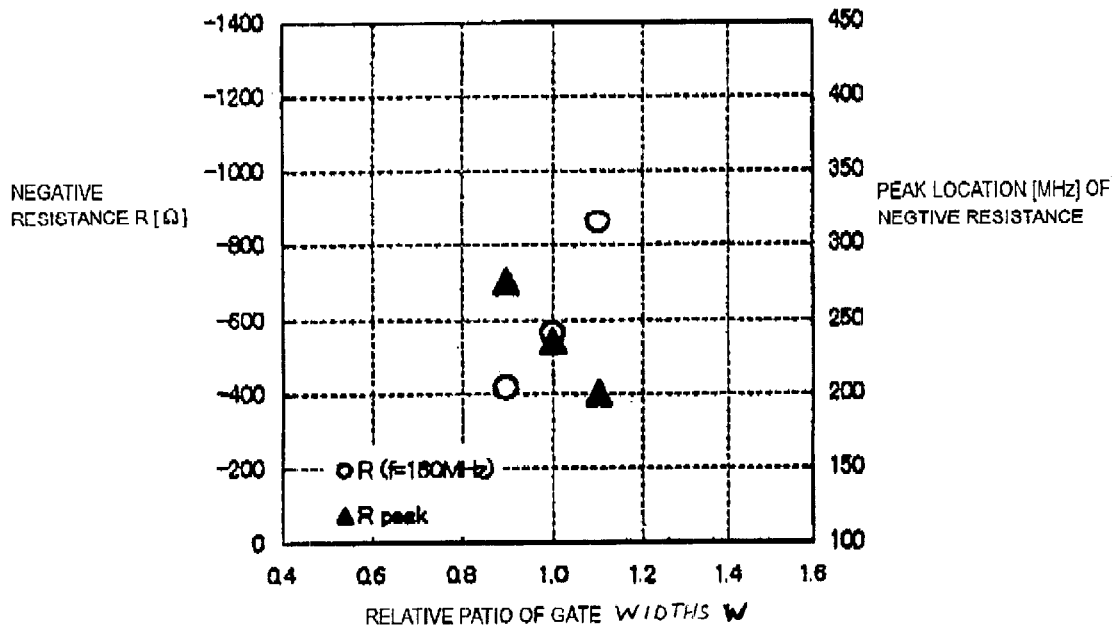
FIG. 10 is a characteristic diagram in which the gate widths of MOS transistors forming CMOS inverters are plotted against negative resistance, illustrating the operation of the circuit shown in FIG. 1.
Figure 11:
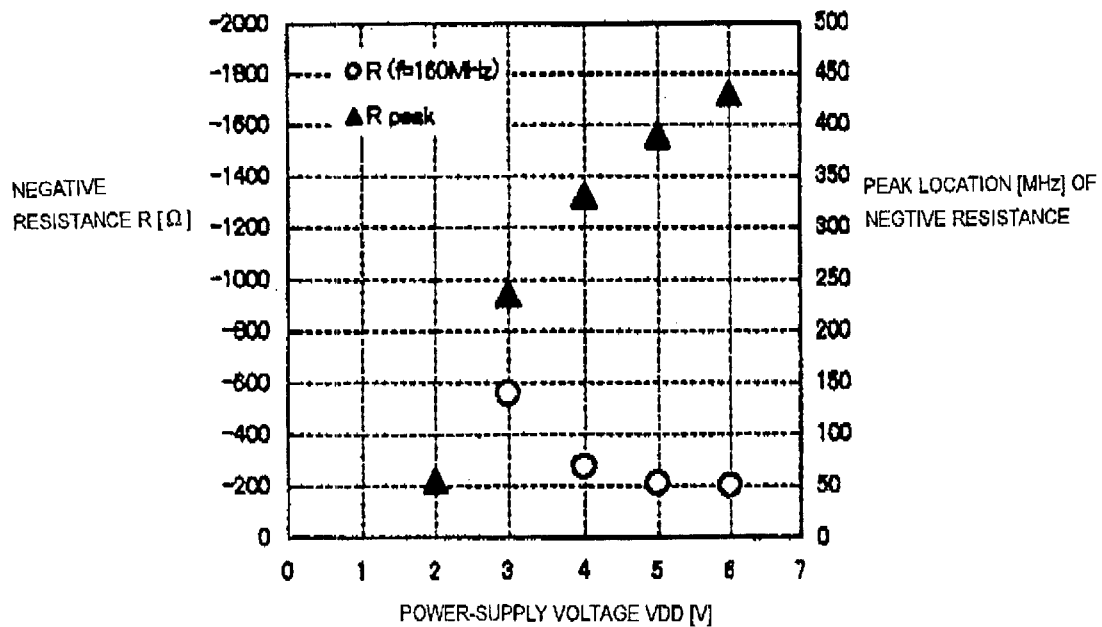
FIG. 11 is a negative resistance-power supply voltage characteristic diagram, illustrating the operation of the circuit shown in FIG. 1.

With respect to the relations between other parameters and the peak $R_{peak}$ of the negative resistance, the relation with the resistor R1 in the filter circuit 5 is shown in FIG. 8. FIG. 9 shows relations obtained where the relative ratios are varied under conditions where the drain lengths of MOS transistors forming the CMOS inverters of the amplifier portion 4 are set to 1. FIG. 10 shows relations obtained where the relative ratio is varied under conditions where the gate widths of MOS transistors forming the CMOS inverters of the amplifier portion 4 are set to 1. The relations with the power-supply voltage are shown in FIG. 11. It can be seen from these diagrams that it is difficult to control the peak $R_{peak}$ of the negative resistance depending on the resistor R1 in the filter circuit 5. Although the peak $R_{peak}$ of the negative resistance may be controlled according to the drain length or gate width of each MOS transistor forming the CMOS inverters of the amplifier portion 4, this procedure is made unrealistic to control the negative resistance thereby. Accordingly, it is desired to control the peak $R_{peak}$ of the negative resistance by adjusting the capacitive element CD or the capacitive element C1 of the filter circuit 5.

As described thus far, the present embodiment can sufficiently amplify the oscillation output that is made weaker as a result of the miniaturization of the piezoelectric oscillator such as a quartz oscillator, which is caused by the use of higher operating frequency. Furthermore, the required negative resistance can be accomplished at still higher frequencies. Consequently, the operating frequency of the oscillator circuit can be improved.

Figure 12:
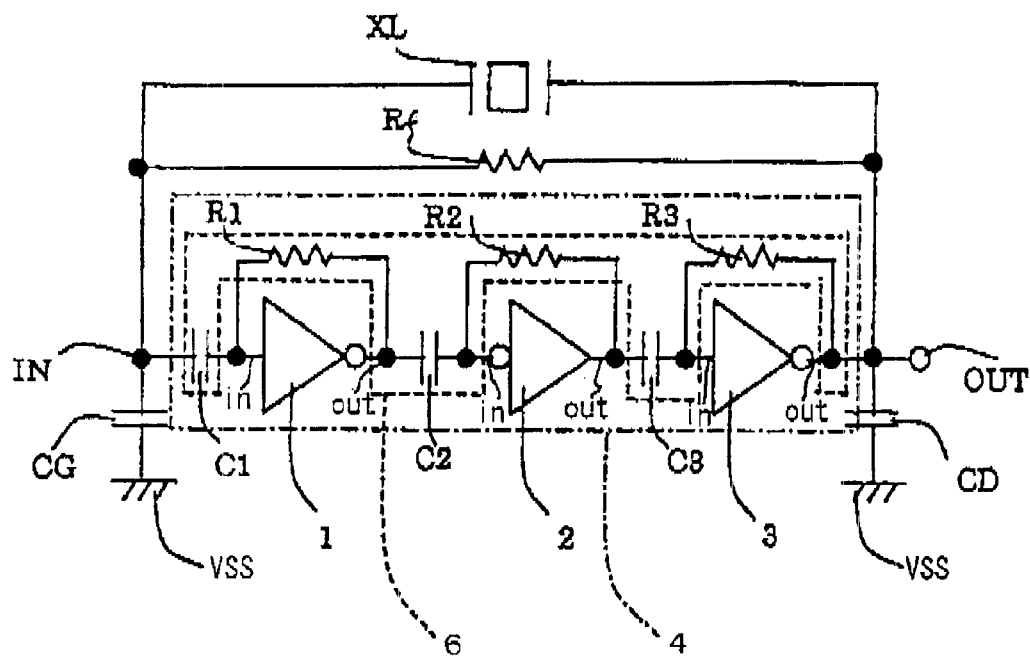
FIG. 12 is a circuit diagram illustrating the configuration of an oscillator circuit in accordance with a second embodiment of the present invention.

A second embodiment is next described. In the first embodiment described above, the filter circuit 5 is formed by the capacitive element C1 and by the resistor R1. The capacitive element C1 is connected with the input terminal in of the CMOS inverter 1. The resistor R1 is connected between the input terminal in and the output terminal out of the CMOS inverter 1. The present invention is not limited to this configuration. For example, as shown in FIG. 12, a filter circuit 6 may be built using resistors R1, R2, R3 and capacitive elements C1, C2, and C3 by connecting the resistors R1, R2 and R3 between the input terminals in and the output terminals out of the CMOS inverters 1, 2, and 3, respectively, and connecting the capacitive elements C1, C2 and C3 with the input terminals in of the CMOS inverters 1, 2, and 3, respectively. This structure has a negative resistance slightly lower than that of the structure shown in FIG. 1 over the whole range where one attempts to obtain the same negative resistance peak as derived from the configuration in FIG. 1. However, this circuit can sufficiently amplify even weak oscillation output in the same way as the first embodiment. Also, the necessary negative resistance can be accomplished at high frequencies.

Figure 13:
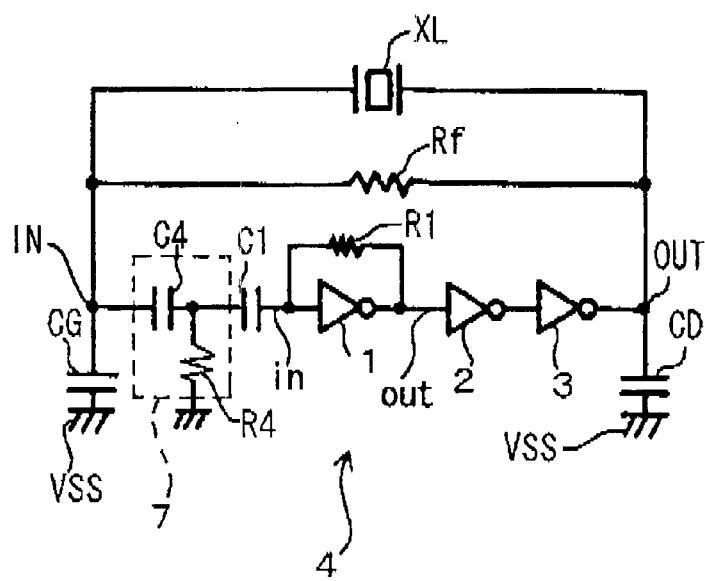
FIG. 13 is a circuit diagram illustrating the configuration of an oscillator circuit in accordance with a third embodiment of the present invention.

A third embodiment is next described. A filter circuit 7 having a capacitive element C4 connected between the input terminal IN and the capacitive element C1 of the oscillator circuit of FIG. 1 and a resistor R4 may be added as shown in FIG. 13. This resistor R4 is connected between the junction of the capacitive elements C1 and C4 and the power-supply terminal VSS. The setting of the negative resistance depends on the filter circuit 7. The capacitive element C1 is used to cut off the DC component of the input to the CMOS inverter 1. The resistor R1 is used to determine the operating point of the CMOS inverter. The oscillator circuit of FIG. 13 can sufficiently amplify quite weak oscillation output in the same way as the above embodiments. The necessary negative resistance can be accomplished at still higher frequencies.

Figure 14:
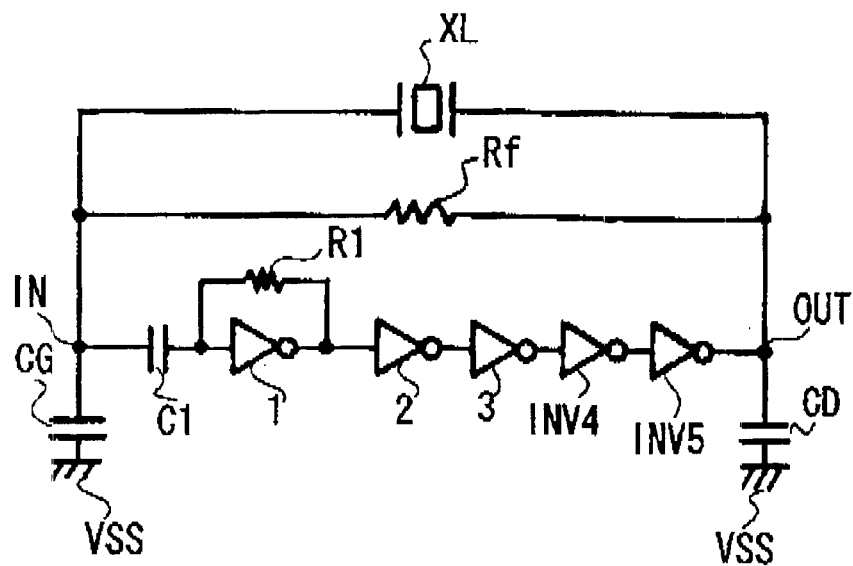
FIG. 14 is a circuit diagram illustrating the configuration of an oscillator circuit in accordance with a fourth embodiment of the present invention.

A fourth embodiment is next described. In the first embodiment described above, the amplifier portion 4 uses three CMOS inverters connected in cascade. As shown in FIG. 14, five CMOS inverters may be connected in cascade. In this first figure, CMOS inverters INV4 and INV5 are connected in cascade in stages following the CMOS inverter 3. Their channel widths are one-half and one-fourth, respectively, of the channel width of the CMOS inverter 3. In addition, five or a greater odd number of CMOS inverters may be connected in cascade. It is to be noted that if the number of stages is increased excessively, each stage will introduce delay, thus lowering the operation frequency. Therefore, the number of stages is preferably set to an appropriate number. Generally, a ring oscillator is constructed by cascading an odd number of inverters and providing feedback from the last stage to the first stage. If an input that is an inversion of the output from the first-stage inverter is applied to the first-stage inverter due to delay introduced by each inverter, the oscillator circuit may be composed of an even number of inverters. If such delay setting is done, the present invention can utilize an even number of CMOS inverters in cascade in its amplifier portion.

Figure 15:
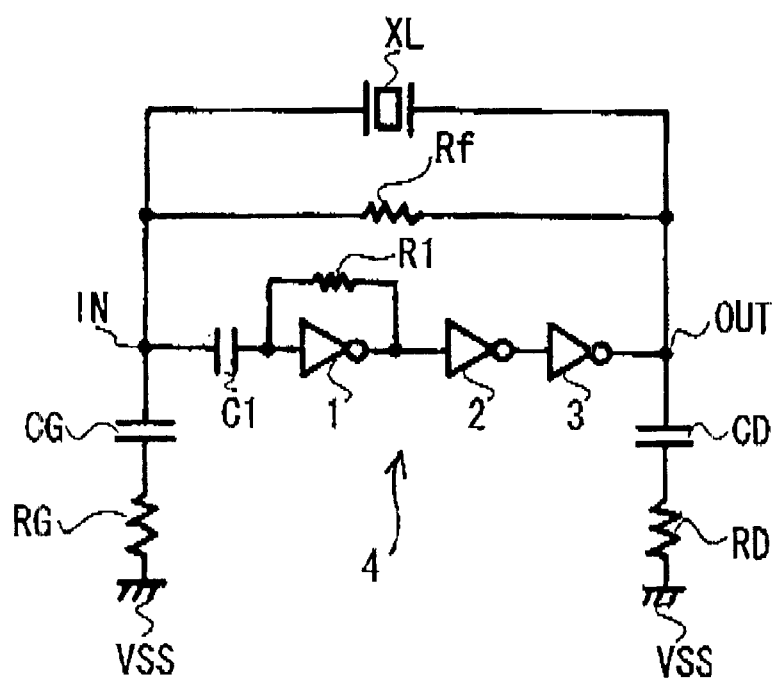
FIG. 15 is a circuit diagram illustrating the configuration of an oscillator circuit in accordance with a fifth embodiment of the present invention.

A fifth embodiment is next described. As a higher frequency is used, a smaller quartz oscillator is used. During operation, there is a danger that the quartz current flowing through the oscillator might destroy it. Therefore, it is necessary to suppress the quartz current. As mentioned previously, in the present invention, the amplifier portion exhibits a sufficient amplification factor even at high frequencies and can sufficiently oscillate even with the weak quartz current. Therefore, as shown in FIG. 15, a resistor RG may be connected with a capacitive element CG between the input terminal IN and the power-supply terminal VSS, and a resistor RD maybe connected with a capacitive element CD between the output terminal OUT and the power-supply terminal VSS. The quartz current is suppressed by the resistors RG and RD. The resistor RG may be only required to be connected between the output terminal OUT and the power-supply terminal VSS, irrespective of whether it is on the side of the power-supply terminal VSS or on the side of the output terminal OUT as viewed from the capacitive element CD. The advantage of the method of connecting the resistors RD and RG in this way is that the effect on the negative resistance is small and thus the quartz current can be suppressed. A circuit using resistors similar to RG and RD is described in detail in Japanese patent laid-open No. 209755/1998 (Japanese patent application No. 5765/1997), entitled "Quartz Oscillator Circuit and Integrated Circuit Device for Quartz Oscillation." Where the present invention is applied to this structure, the quartz current can be suppressed more positively, because the amplification factor is compensated sufficiently in the amplifier portion.

Figure 16A:
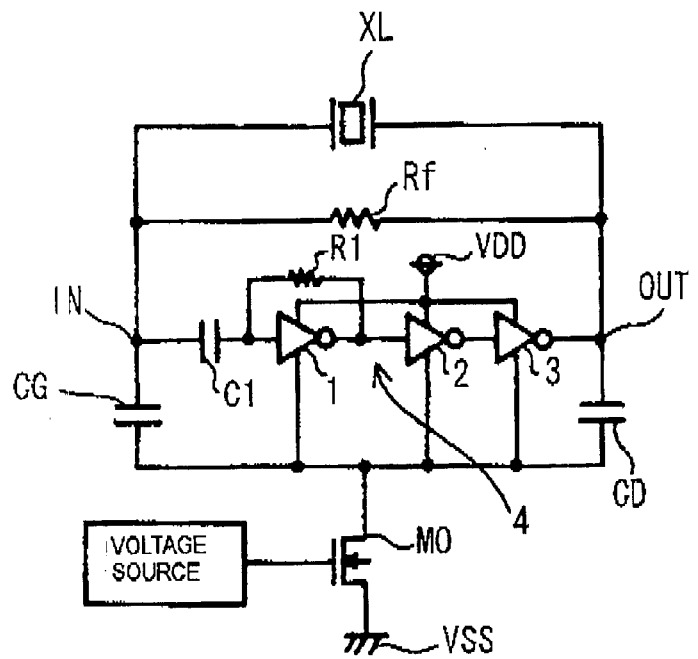
FIGS. 16A and 16B are circuit diagrams illustrating the configuration of an oscillator circuit in accordance with a sixth embodiment of the present invention.

A sixth embodiment is next described. In the first embodiment described above, the capacitive elements CG and CD are directly connected with the power-supply terminal VSS. The sources of the N-channel MOS transistors forming the CMOS inverters are normally connected with the power-supply terminal VSS in a manner not described. The present invention is not limited to this configuration. For instance, as shown in FIG. 16A, the current value supplied to the oscillator circuit may be limited by connecting capacitive elements CG and CD and the sources of the N-channel MOS transistor acting as a current-limiting device. This suppresses variation in power-supply voltage on the oscillation operation. In consequence, stable oscillation operation is permitted. In this case, a voltage is applied from the voltage source to the gate of the N-channel MOS transistor MO. In this way, the current value supplied to the oscillator circuit is controlled.

Figure 16B:
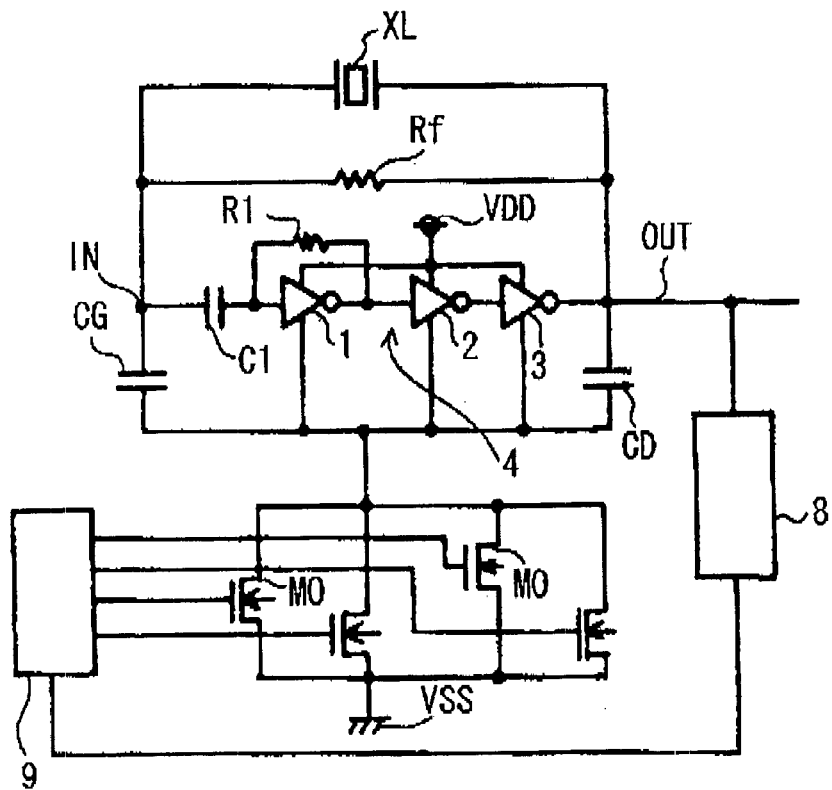

As shown in FIG. 16B, N-channel MOS transistors MO serving as current-limiting elements may be connected in parallel. The oscillation output from the output terminal OUT may be monitored with a detection circuit 8. The N-channel MOS transistors MO may be controlled by a control circuit 9 according to the result of detection made by the detection circuit 8. In the initial stage of oscillation operation, the amplitude of the oscillation output is small. Under this condition, all the MOS transistors are turned on to supply a larger amount of electric current into the oscillator circuit. As the oscillation operation becomes more stabilized, the MOS transistor to MO are successively turned off, thus limiting the supply of electric current. In this manner, lower power consumption is accomplished.

A circuit using such a current-limiting device is described in detail in Japanese patent laid-open No. 150419/1999 (Japanese patent application No. 313020/1997), entitled "Oscillator Circuit." In the circuit using the current-limiting device, the oscillation output of the quartz oscillator is lowered by the current-limiting device. Where the present invention is applied, the amplifier portion exhibits a sufficiently large amplification factor at high frequencies as mentioned previously. The oscillator circuit can be oscillated sufficiently even with a weak quartz current. Consequently, the current-limiting device can be utilized more positively. This further stabilizes the oscillation operation and achieves more power consumption saving. Additionally, in the present invention, these can be attained during oscillation operation at still higher frequencies.

Figure 21A:
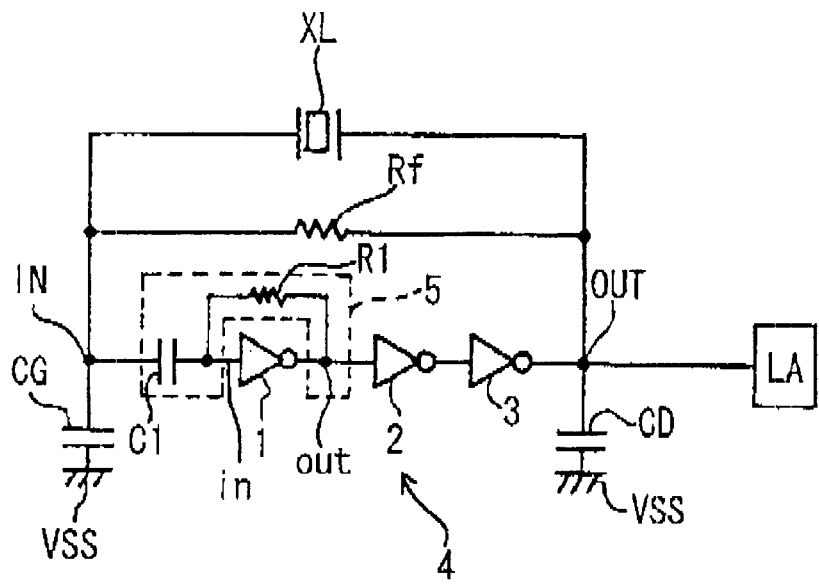
FIGS. 21A and 21B are circuit diagrams illustrating the configuration of an oscillator circuit in accordance with a seventh embodiment of the invention.

A seventh embodiment is next described. In the oscillation circuit in accordance with the first embodiment described in connection with FIG. 1, an output terminal for delivering an output signal to a later stage in the circuit is connected with the output terminal of the last-stage CMOS inverter 3 of the amplifier portion 4, i.e., the output terminal OUT of the amplifier portion 4, as show in FIG. 21A. Notice that the present invention is not limited to this configuration. For example, as shown in FIG. 21B, the output terminal to a later-stage circuit LA may be connected with the output terminal out2 of a CMOS inverter 2 in a stage immediately preceding the last-stage CMOS inverter 3, and the output signal from the oscillator circuit may be sent to the later-stage circuit LA.

Figure 21B:
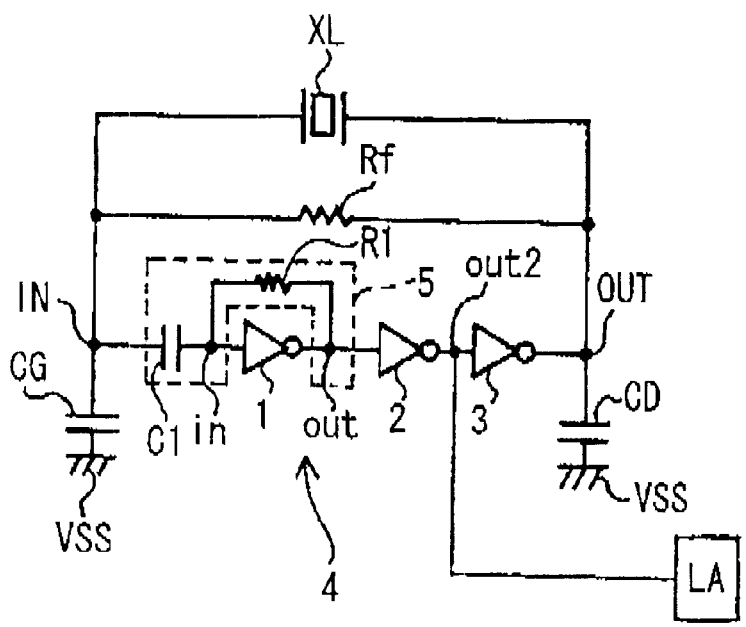
Figure 22:
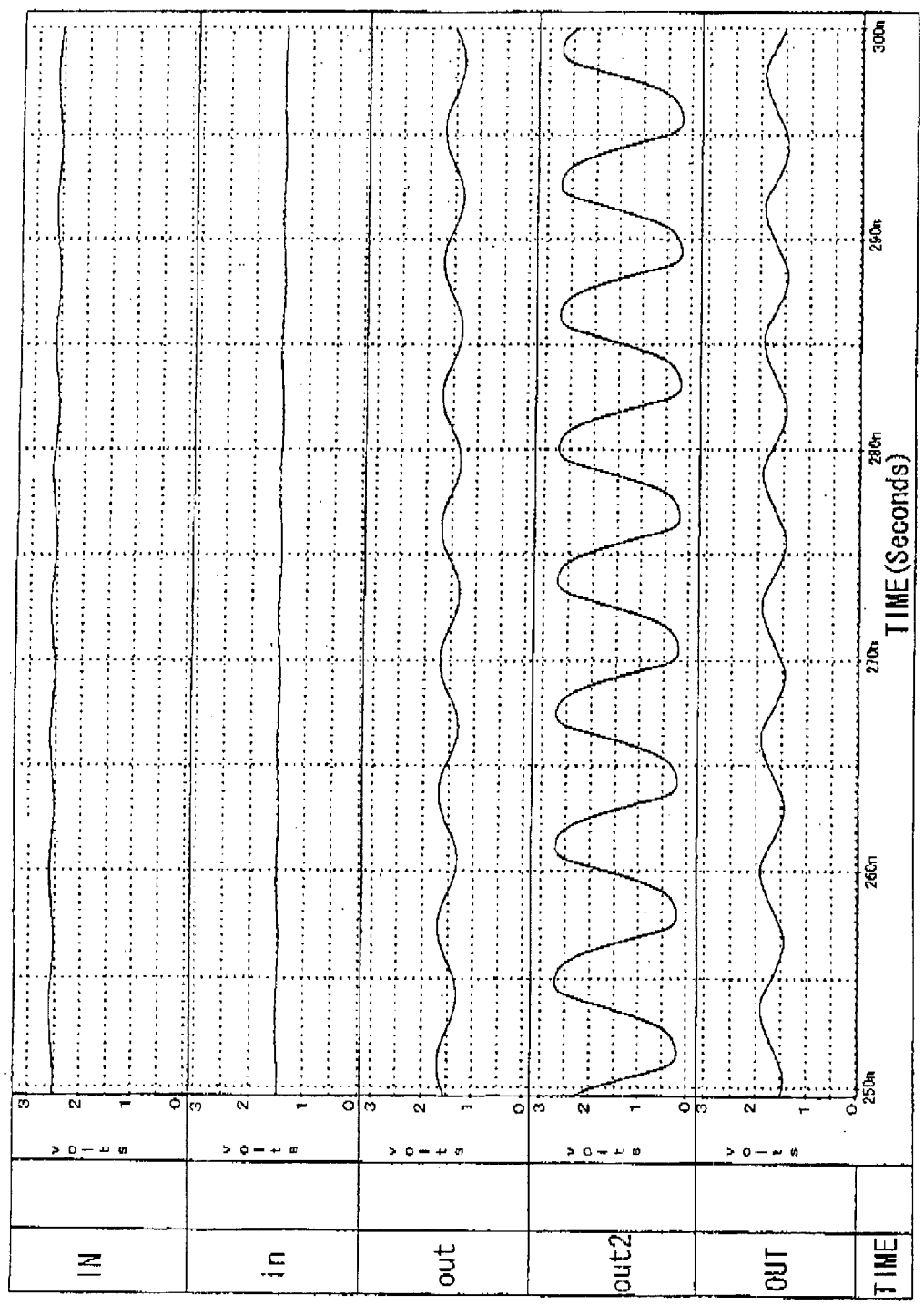
FIG. 22 is a terminal voltage-time characteristic diagram of an amplifier circuit, illustrating the operation of the circuit shown in FIG. 21A.

A simulation of the oscillator circuit of FIG. 21B was conducted, using specific parameters. The resulting amplitudes at the input terminal IN of the amplifier portion 4, at the input terminal in of the CMOS inverter 1, at the output terminal out of the CMOS inverter 1, at the output terminal out2 of the CMOS inverter 2, and at the output terminal OUT of the amplifier portion 4 are shown in FIG. 22. As can be seen from FIG. 22, the amplitude of the oscillated signal appearing at the output terminal out2 of the CMOS inverter 2 is much greater than the amplitudes at the other terminals. That is, the load at the output terminal out2 of the CMOS inverter 2 in a stage immediately preceding the output terminal OUT to which the quartz oscillator and a load capacitor are connected is less than the load at the output terminal OUT. The amplitude of the oscillated signal is larger accordingly.

Where the configuration in accordance with the present embodiment is used in this way, an output signal having larger amplitude can be delivered to the later-stage circuit LA than where the output terminal for delivering an output signal to the later-stage circuit LA is connected with the output terminal OUT of the amplifier portion 4.

Figure 23:
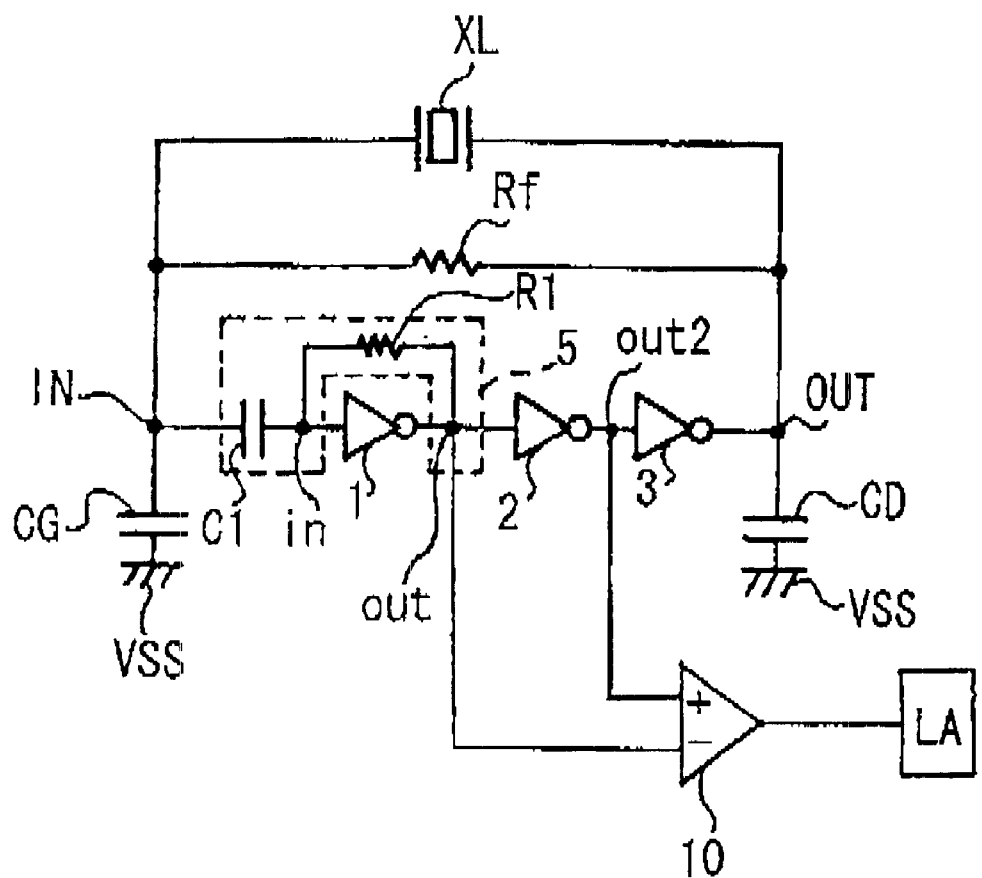
FIG. 23 is a circuit diagram illustrating the configuration of an oscillator circuit in accordance with an eighth embodiment of the invention.

An eighth embodiment is next described. In the oscillator circuit in accordance with the seventh embodiment described in connection with FIG. 21B, the output terminal for the later-stage circuit LA is connected with the output terminal out2 of the CMOS inverter 2 that is in a stage immediately preceding the last-stage CMOS inverter 3, and the output signal from the oscillator circuit is delivered to the later-stage circuit LA. The invention is not limited to this configuration. For example, as shown in FIG. 23, one input terminal of a differential amplifier circuit 10 may be connected with the output terminal out2 of the CMOS inverter 2 in a stage immediately preceding the last-stage CMOS inverter 3, and the other input terminal of the differential amplifier circuit 10 may be connected with the output terminal out of the first-stage CMOS inverter 1 to cause the differential output circuit 10 to send an output signal to the later-stage circuit LA.

As described in the seventh embodiment in connection with FIG. 22, the oscillation amplitude at the output terminal out2 of the CMOS inverter 2 is large, while the oscillation amplitude at the output terminal out of the CMOS inverter 1 is small. The oscillation signal at the terminal out2 is substantially an inversion of the oscillation signal at the terminal out and so the difference between these two signals is large. Accordingly, in the configuration in accordance with the present embodiment, the differential amplifier circuit 10 takes and amplifies the difference between the oscillation signal at the terminal out2 and the oscillation signal at the terminal out. Therefore, an output signal of a larger amplitude can be delivered to the later-stage circuit than where the output terminal for delivering an output signal to the later-stage circuit is connected with the output terminal of the amplifier portion, in the same way as in the seventh embodiment described above.

In the various embodiments described above, the components excluding the piezoelectric oscillator such as a quartz oscillator are preferably integrated as one chip. At this time, the capacitive elements CD and CG becoming capacitive element and load capacitor, respectively, in the filter circuit are fabricated from intermetallic capacitors. The feedback resistor Rf and the various resistors in the filter circuit are fabricated from thin-film resistors. As a result, the values of these resistors can be optimized accordingly to the required oscillation frequency, the size of the piezoelectric oscillator, the shape, and other dimensions. This permits accurate oscillation operation.

In the above-described embodiments, the capacitive elements CG and CD are connected with the side of the power-supply terminal VSS (0 V). Instead, they may be connected with the side of the power-supply terminal VDD (3 V). In this case, the resistors RG and RD are similarly connected with the side of the power-supply terminal VDD (3 V) in the oscillator circuit of FIG. 15. In the oscillator circuits shown in FIGS. 16A and 16B, the MOS transistors acting as current-limiting devices are P-channel MOS transistors connected with the side of the power-supply terminal VDD (3 V).

An oscillator circuit in accordance with the present invention has an amplifier portion consisting of plural CMOS inverters connected in cascade. MOS transistors forming the CMOS inverters have gate areas that decrease successively in going from the first stage to the last stage. Especially, their channel lengths are made equal. They have successively smaller channel widths. The amplification factor of the amplifier portion at high frequencies is improved. The oscillator circuit can amplify the weak oscillation output from a piezoelectric oscillator at high frequencies. Also, a filter circuit is included in the amplifier portion to achieve a peak of negative resistance at high frequencies. This can enhance the operating frequency of the oscillator circuit.

Furthermore, a negative resistance having a peak at a desired frequency can be accomplished by controlling the values of the capacitive elements of the filter circuit. A negative resistance necessary to stable oscillation operation at desired frequencies can be obtained. Where the components excluding the piezoelectric oscillator are integrated as one chip, the values of the capacitive elements of the filter circuit determining the negative resistance can be set accurately. This permits stable oscillation operation. Especially, where the various load capacitors and the capacitive elements in the filter circuit are fabricated from intermetallic capacitors and the various resistors are made of thin-film resistors, these values can be set more accurately. Hence, more stable oscillation operation is enabled.

In addition, a negative resistance having a peak can be accomplished at high frequencies. This allows fifth or higher-order overtone oscillation. Where components are integrated as one chip as mentioned above, external coils or capacitive elements are unnecessary, unlike in the prior art technique. High-order overtone oscillation is enabled only with an IC chip. If those components were mounted, the circuit area would be increased. Also, labor would be necessary to set the values of these elements. These disadvantages are eliminated by the invention.

Moreover, in the present invention, operation is permitted if the oscillation output from a piezoelectric oscillator is quite weak as described above. During oscillation at high frequencies, destruction of the piezoelectric oscillator due to the current flowing through the piezoelectric oscillator can be prevented. If a resistor is connected with the load capacitor to suppress the current flowing through the piezoelectric oscillator, stable oscillation is permitted although the oscillation output is still weakened by the connected resistor. Consequently, during high frequency oscillation, the current flowing through the piezoelectric oscillator can be suppressed further. The phenomenon that the piezoelectric oscillator is destroyed during oscillation at high frequencies can be suppressed effectively. For the same frequency, the danger of destruction decreases. The frequency at which the same degree of danger is created can be elevated. In consequence, the operating frequency of the oscillator circuit can be enhanced.

Additionally, in the present invention, operation is possible even if the oscillation output from the piezoelectric oscillator is quite weak as mentioned previously. Stable oscillation operation is enabled, even if the oscillation output is weakened further due to connection of the current-limiting device, by connecting the capacitive element CG, CD and the sources of the MOS transistors forming the CMOS inverters with the power-supply potential via the current-limiting device to achieve lower power consumption and to suppress variations in the power-supply voltage synchronized to the oscillation. Therefore, the effects of the current-limiting device can be made greater. The adverse effects of variations in the power-supply voltage can be suppressed further. In addition, the further power saving can be attained. Further, such advantages can also be derived from an oscillator circuit performing an oscillation operation at higher frequencies.

Further, in the present invention, an oscillation signal of great amplitude can be sent to a later-stage circuit by connecting the output terminal for delivering the output terminal of the CMOS inverter in a stage immediately preceding the last-stage of the amplifier portion.

In addition, in the present invention, one input terminal of a differential amplifier circuit is connected with the input terminal of a CMOS inverter in a stage immediately preceding the last stage of an amplifier portion. The other input terminal of the differential amplifier circuit is connected with the output terminal of the CMOS inverter. An oscillation signal of greater amplitude can be sent to a later stage circuit by delivering an output signal to be sent to the later-stage circuit from the output terminal of the differential amplifier circuit.

Having described this invention with regard to specific embodiments, it is to be understood that the description is not meant as a limitation since further variations or modifications may be apparent or may suggest themselves to those skilled in the art. For example, any number of CMOS inverters may be cascaded with or without decreasing the gate areas of all or some of them. Further, an output signal may be taken from any CMOS inverter stage. Further, differential output from any of the stages may be obtained. It is intended that the present application cover such variations and modifications as fall within the scope of the appended claims.

What is claimed is:

1. An oscillator circuit comprising:
    an amplifier portion, said amplifier portion comprising a plurality of CMOS inverters connected in cascade and a filter circuit, said amplifier portion having an input terminal and an output terminal;
    an oscillator connected between said input terminal and said output terminal of said amplifier portion;
    a feedback resistor connected between said input terminal and said output terminal of said amplifier portion;
    a first load capacitance connected between said input terminal of said amplifier portion and a terminal at a certain potential; and
    a second load capacitance connected between said output terminal of said amplifier portion and said terminal at the certain potential;
        wherein said CMOS inverters have gate areas, said gate areas decreasing successively from a first CMOS inverter to a last CMOS inverter of said plurality of CMOS inverters connected in cascade.

2. The oscillator circuit of claim 1, wherein said filter circuit is configured such that a circuit formed by said amplifier portion, said feedback resistor, said first load capacitance and said second load capacitance has a negative resistance, said negative resistance exhibiting a peak at a given frequency.

3. The oscillator circuit of claim 1, wherein said filter circuit is connected into a signal path between said input terminal and said output terminal of said amplifier portion, wherein each of said plurality of CMOS inverters further comprises an input terminal and an output terminal, wherein a capacitive element is connected with an input terminal of at least one of said CMOS inverters, and wherein a resistor is connected between said input terminal and an output terminal of said CMOS inverter with which said capacitive element is connected.

4. The oscillator circuit of claim 3, wherein said capacitive element is connected between said input terminal of said amplifier portion and an input terminal of said first CMOS inverter of said amplifier portion; and said resistor is connected between said input terminal of said first CMOS inverter and an output terminal of said first CMOS inverter.

5. The oscillator circuit of claim 3, further comprising a circuit output terminal for delivering an output signal to a later-stage circuit, said circuit output terminal being connected with an output terminal of a CMOS inverter immediately preceding said last CMOS inverter of said amplifier portion.

6. The oscillator circuit of claim 3, further comprising a differential amplifier circuit, said differential amplifier having:
- a first input terminal connected with an input terminal of a CMOS inverter immediately preceding said last CMOS inverter of said amplifier portion,
- a second input terminal connected with an output terminal of said CMOS inverter immediately preceding said last CMOS inverter of said amplifier portion, and
- an output terminal for delivering an output signal to a later-stage circuit.

7. The oscillator circuit of claim 1, wherein said CMOS inverters in said amplifier portion have channel lengths and have channel widths, said channel lengths of said CMOS inverters being identical and said channel widths of said CMOS inverters decreasing successively from said first CMOS inverter to said last CMOS inverter.

8. The oscillator circuit of claim 1, wherein a first signal path is formed by said input terminal of said amplifier portion and by said certain potential, and a second signal path is formed by said output terminal of said amplifier portion and by said certain potential, and wherein a resistor for suppressing current flowing through said oscillator is connected in at least one of said first and said second signal paths.

9. The oscillator circuit of claim 1, wherein said CMOS inverters further comprise MOS transistors, said MOS transistors having sources, and wherein said sources of said MOS transistors and said terminal at said certain potential are connected with a power-supply potential via a current-limiting device.

10. The oscillator circuit of claim 9, wherein said oscillator circuit produces oscillation output, wherein said current-limiting device comprises a plurality of MOS transistors connected in parallel, wherein all of said MOS transistors of said current-limiting device are turned on during the initial stage of production of said oscillation output, and wherein said MOS transistors of said current-limiting device are successively turned off during stabilization of said oscillation output.

11. The oscillator circuit of claim 1, wherein said oscillator is a piezoelectric oscillator.

12. The oscillator circuit of claim 1, wherein said oscillator is a surface-acoustic-wave oscillator.

13. An oscillator circuit comprising:
- an amplifier portion comprising at least a first, a second, and a third CMOS inverters connected in cascade, said CMOS inverters having gate areas that decrease successively from said first to a last inverter in said amplifier portion, said amplifier portion further comprising an input terminal and an output terminal, and each of said CMOS inverters further comprising an input terminal and an output terminal;
- a filter circuit comprising a capacitive element and a resistor, said capacitive element and said resistor being connected between an input terminal and an output terminal of said first CMOS inverter, said capacitive element having one terminal connected with said input terminal of said first CMOS inverter and having another terminal acting as said input terminal of said amplifier portion;
- a piezoelectric oscillator connected between said input terminal and said output terminal of said amplifier portion;
- a feedback resistor connected between said input terminal and said output terminal of said amplifier portion;
- a first load capacitance connected between said input terminal of said amplifier portion and a terminal at a certain potential; and
- a second load capacitance connected between said output terminal of said amplifier portion and said terminal at said certain potential.

14. The oscillator circuit of claim 13, wherein a first signal path is formed by said input terminal of said amplifier portion and by said certain potential, and a second signal path is formed by said output terminal of said amplifier portion and by said certain potential, and wherein a resistor for suppressing current flowing through said piezoelectric oscillator is connected in at least one of said first and said second signal paths.

15. The oscillator circuit of claim 13, wherein said CMOS inverters further comprise MOS transistors, said MOS transistors having sources, and wherein said sources of said MOS transistors and said terminal at said certain potential are connected with a power-supply potential via a current-limiting device.

16. The oscillator circuit of claim 15, wherein said oscillator circuit produces oscillation output, wherein said current-limiting device comprises a plurality of MOS transistors connected in parallel, wherein all of said MOS transistors of said current-limiting device are turned on during the initial stage of production of said oscillation output, and wherein said MOS transistors of said current-limiting device are successively turned off during stabilization of said oscillation output.

17. The oscillator circuit of claim 13, wherein said piezoelectric oscillator is a quartz oscillator effecting overtone oscillation.

18. The oscillator circuit of claim 13, further comprising a circuit output terminal for delivering an output signal to a later-stage circuit, said circuit output terminal being connected with an output terminal of a CMOS inverter immediately preceding said last CMOS inverter of said amplifier portion.

19. The oscillator circuit of claim 13, further comprising a differential amplifier circuit, said differential amplifier circuit having a first input terminal connected with an input terminal of a CMOS inverter immediately preceding said last CMOS inverter of said amplifier portion, a second input terminal connected with an output terminal of said CMOS inverter immediately preceding said last CMOS inverter of said amplifier portion, and an output terminal for delivering an output signal to a later-stage circuit.

20. An integrated circuit for oscillation comprising;
- an amplifier portion comprising an input terminal, an output terminal, a plurality of CMOS inverters connected in cascade and a filter circuit;
- a feedback resistor connected between said input terminal and said output terminal of said amplifier portion;
- a first load capacitance connected between said input terminal of said amplifier portion and a terminal at a certain potential;
- a second load capacitance connected between said output terminal of said amplifier portion and said terminal at said certain potential;

wherein said CMOS inverters have gate areas, said gate areas decreasing successively from a first CMOS inverter to a last CMOS inverter of said plurality of CMOS inverters connected in cascade, and wherein said input terminal and said output terminal of said amplifier portion are for receiving signals from an oscillator to perform an oscillation operation.

21. An integration circuit for oscillation as set forth in claim 20, wherein said filter circuit has an oscillation portion, and wherein said oscillation portion shows a negative resistance exhibiting a peak at a given frequency.

22. An integrated circuit for oscillation as set forth in claim 20, wherein each of said CMOS inverters comprises an input terminal and an output terminal.

23. An integrated circuit for oscillation as set forth in claim 22, wherein said filter circuit is located in a signal path between said input terminal and said output terminal of said amplifier portion, wherein a capacitive element is connected with an input terminal of at least one of said CMOS inverters; and wherein a resistor is connected between said input terminal and an output terminal of said CMOS inverter with which said capacitive element is connected.

24. An integrated circuit for oscillation as set forth in claim 22, wherein said filter circuit comprises a capacitive element, said capacitive element being connected between said input terminal of said amplifier portion and an input terminal of said first CMOS inverter of said amplifier portion; and a resistor, said resistor being connected between said input terminal and an output terminal of said first CMOS inverter of said amplifier portion.

25. An integrated circuit for oscillation as set forth in claim 20, wherein said CMOS inverters in said amplifier portion have channel lengths and have channel widths, said channel lengths of said CMOS inverters being identical and said channel widths of said CMOS inverters decreasing successively from said first CMOS inverter to said last CMOS inverter.

26. An integrated circuit for oscillation comprising:
   an amplifier portion consisting of at least a first, a second, and a third CMOS inverters connected in cascade, said CMOS inverters having gate areas that decrease successively from said first to a last inverter in said amplifier potion, said amplifier portion further comprising an input terminal and an output terminal, and each of said CMOS inverters further comprising an input terminal and an output terminal;
   a filter circuit consisting of a capacitive element and a resistor, said capacitive element and said resistor being connected between an input terminal and an output terminal of said first CMOS inverter, said capacitive element having one terminal connected with said input terminal of said first CMOS inverter and having another terminal acting as said input terminal of said amplifier portion;
   a feedback resistor connected between said input terminal and said output terminal of said amplifier portion;
   a first load capacitance connected between said input terminal of the amplifier portion and a terminal at a certain potential; and
   a second load capacitance connected between said output terminal of said amplifier portion and said terminal at said certain potential;
   wherein said input terminal and said output terminal of said amplifier portion are for receiving signals from an oscillator to perform an oscillation operation.

27. An integrated circuit for oscillation as set forth in claim 26, wherein a first signal path is formed by said input terminal of said amplifier portion and by said certain potential, and a second signal path is formed by said output terminal of said amplifier portion and by said certain potential, and wherein a resistor for suppressing current flowing from said oscillator is connected in at least one of said first and said second signal paths.

28. An integrated circuit for oscillation as set forth in claim 26, wherein said CMOS inverters further comprise MOS transistors, said MOS transistors having sources, and wherein said sources of said MOS transistors and said terminal at said certain potential are connected with a power-supply potential via a current-limiting device.

29. An integrated circuit for oscillation as set forth in claim 28, wherein said integrated circuit for oscillation produces an oscillation output, wherein said current-limiting device comprises a plurality of MOS transistors connected in parallel, wherein all of said MOS transistors of said current-limiting device are turned on during the initial stage of production of said oscillation output, and wherein said MOS transistors of said current-limiting device are successively turned off during stabilization of said oscillation output.

30. An integrated circuit for oscillation as set forth in claim 26, wherein said piezoelectric oscillator is a quartz oscillator effecting overtone oscillation.

31. An integrated circuit for oscillation as set forth in claim 26, wherein said capacitive element of said filter circuit, said first load capacitor and said second load capacitor are intermetallic capacitors, and wherein said resistor of said filter circuit and said feedback resistor are thin-film resistors.

32. An integrated circuit for oscillation as set forth in claim 26, further comprising a circuit output terminal for delivering an output signal to a later-stage circuit, said circuit output terminal being connected with an output terminal of a CMOS inverter immediately preceding said last CMOS inverter of said amplifier portion.

33. An integrated circuit for oscillation as set forth claim 26 further comprising a differential amplifier circuit, said differential amplifier circuit having a first input terminal connected with an input terminal of a CMOS inverter immediately preceding said last CMOS inverter of said amplifier portion, a second input terminal connected with an output terminal of said CMOS inverter immediately preceding said last CMOS inverter of said amplifier portion, and an output terminal for delivering an output signal to a later-stage circuit.

* * * * *